(12) United States Patent
Ryu et al.

(10) Patent No.: US 11,308,730 B2
(45) Date of Patent: Apr. 19, 2022

(54) DISPLAY DEVICE

(71) Applicant: Samsung Display Co., Ltd., Yongin-si (KR)

(72) Inventors: Ji-Hun Ryu, Hwaseong-si (KR); Ilnam Kim, Hwaseong-si (KR); Jae-Kyoung Kim, Hwaseong-si (KR); Jongin Baek, Hwaseong-si (KR); Eunjin Sung, Yongin-si (KR); Seongryong Lee, Hwaseong-si (KR); Jonghyun Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/136,497

(22) Filed: Dec. 29, 2020

(65) Prior Publication Data
US 2021/0295006 A1 Sep. 23, 2021

(30) Foreign Application Priority Data

Mar. 20, 2020 (KR) ........................ 10-2020-0034223

(51) Int. Cl.
G06V 40/13 (2022.01)
G06F 3/044 (2006.01)
(Continued)

(52) U.S. Cl.
CPC ........ *G06V 40/1318* (2022.01); *G06F 3/0412* (2013.01); *G06F 3/0445* (2019.05);
(Continued)

(58) Field of Classification Search
CPC .... G06F 1/1616; G06F 1/1641; G06F 1/1643; G06F 1/1652; G06F 1/1677;
(Continued)

(56) References Cited

U.S. PATENT DOCUMENTS 10,268,884 B2 4/2019 Jones et al.
10,831,244 B1 * 11/2020 DeMaio ................ G06F 1/1656
(Continued)

FOREIGN PATENT DOCUMENTS

EP 3514726 A1 7/2019
GN 208141720 U 11/2018
(Continued)

OTHER PUBLICATIONS

Extended European Search Report for Application No. 21161798.0, dated Aug. 18, 2021, 9 pages.

*Primary Examiner* — Nelson M Rosario
(74) *Attorney, Agent, or Firm* — Lewis Roca Rothgerber Christie LLP

(57) ABSTRACT

Provided is a display device including a display panel defining a folding area and a non-folding area and including a base layer, a circuit layer on the base layer, and a display element layer on the circuit layer, an input sensor below the display panel and defining a sensing area overlapping the non-folding area, and a light shielding layer between the display element layer and the input sensor, where the light shielding layer defines a plurality of holes in a first portion of the light shielding layer at the non-folding area, and a cut portion in a second portion of the light shielding layer at the folding area.

23 Claims, 19 Drawing Sheets

(51) Int. Cl.
*G06F 3/041* (2006.01)
*H01L 27/32* (2006.01)
*G06F 1/16* (2006.01)
*H04M 1/02* (2006.01)

(52) U.S. Cl.
CPC ........ *H01L 27/323* (2013.01); *H01L 27/3272* (2013.01); *G06F 1/1641* (2013.01); *G06F 2203/04102* (2013.01); *H01L 2251/5338* (2013.01); *H04M 1/0268* (2013.01)

(58) Field of Classification Search
CPC .... G06F 1/1681; G06F 1/169; G06F 3/03545; G06F 3/1423; G06F 2200/1632; H02J 50/10
See application file for complete search history.

(56) References Cited

U.S. PATENT DOCUMENTS

| | | | |
|---|---|---|---|
| 2015/0378557 A1* | 12/2015 | Jeong | H04M 1/0214 715/835 |
| 2017/0351898 A1 | 12/2017 | Zhang | |
| 2018/0032189 A1* | 2/2018 | Lee | G06F 3/0443 |
| 2020/0104562 A1 | 4/2020 | Sung et al. | |
| 2020/0273379 A1 | 8/2020 | Wang et al. | |

FOREIGN PATENT DOCUMENTS

| | | |
|---|---|---|
| GN | 110709860 A | 1/2020 |
| KR | 10-2018-0062271 A | 6/2018 |
| KR | 10-2019-0081335 A | 7/2019 |
| KR | 10-2020-0038388 A | 4/2020 |
| WO | 2020191601 A1 | 10/2020 |

* cited by examiner

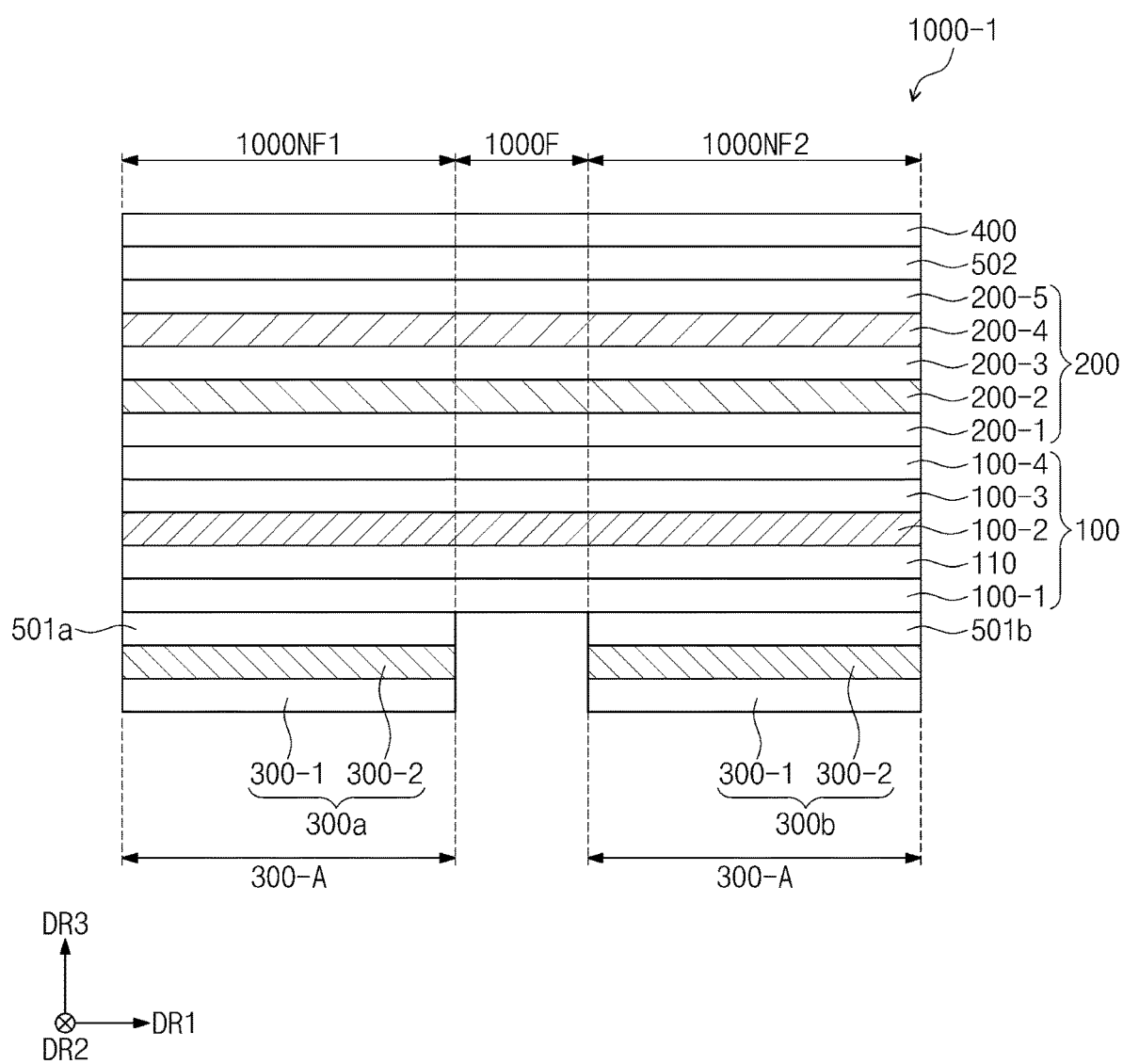

DISPLAY DEVICE

CROSS-REFERENCE TO RELATED APPLICATION

This application claims priority to and the benefit of Korean Patent Application No. 10-2020-0034223, filed on Mar. 20, 2020, the entire content of which is hereby incorporated by reference.

BACKGROUND

The present disclosure herein relates to a display device having a fingerprint recognition function.

A display device displays an image to provide information to a user or provides various functions communicating with a user, e.g., a function of sensing an input of a user. In recent years, display devices have included a function for sensing a fingerprint of a user. A fingerprint recognition method includes a capacitive method of sensing capacitance variation between electrodes, an optical method of sensing incident light by using an optical sensor, and an ultrasonic wave method of sensing a vibration by using a piezoelectric body.

SUMMARY

An aspect of the present disclosure provides a display device capable of recognizing a fingerprint and having improved flexibility.

An embodiment of the present disclosure provides a display device including: a display panel defining a folding area and a non-folding area and including a base layer, a circuit layer on the base layer, and a display element layer on the circuit layer; an input sensor below the display panel and defining a sensing area overlapping the non-folding area; and a light shielding layer between the display element layer and the input sensor. The light shielding layer defines a plurality of holes in a first portion of the light shielding layer at the non-folding area, and a cut portion extending in a direction in a second portion of the light shielding layer at the folding area.

In an embodiment, the circuit layer may include a semiconductor pattern on the base layer, an insulation layer covering the semiconductor pattern, and a conductive layer on the insulation layer, and where the cut portion may not overlap the semiconductor pattern.

In an embodiment, the cut portion may overlap the conductive layer.

In an embodiment, the light shielding layer may be configured to receive a voltage.

In an embodiment, the light shielding layer may be electrically connected to the circuit layer.

In an embodiment, the folding area and the non-folding area may be adjacent to each other in a first direction, and the cut portion may extend in a second direction crossing the first direction.

In an embodiment, the cut portion may define a plurality of primary slits, and the plurality of primary slits may be spaced apart from each other in the first direction.

In an embodiment, the light shielding layer may have a width in the second direction, where the width of the light shielding layer is greater than a length of each of the plurality of primary slits in the second direction.

In an embodiment, the cut portion may further include a secondary slit configured to connect at least two the plurality of primary slits with each other.

In an embodiment, the display panel may define a display area configured to display an image and a non-display area adjacent to the display area, and the secondary slit may be in the non-display area.

In an embodiment, the input sensor may overlap the folding area and the non-folding area, and the input sensor may define a non-sensing area, and the non-sensing area may overlap the folding area.

In an embodiment, the input sensor may not overlap the non-folding area of the display panel.

In an embodiment, the input sensor may include a plurality of sensing elements in the sensing area, and the plurality of sensing elements may be configured to sense light passing through the plurality of holes.

In an embodiment, the cut portion may have a depth equal to a thickness of the light shielding layer.

In an embodiment, the cut portion may have a depth less than a thickness of the light shielding layer.

In an embodiment, each of the plurality of holes may have an area different from that of the cut portion in a plan view (e.g., when viewed on a plane).

In an embodiment, the light shielding layer may be between the base layer and the circuit layer, and the light shielding layer may be contained in the display panel.

In an embodiment of the present disclosure, a display device includes: an input sensor; a base layer on the input sensor; a circuit layer on the base layer and including a semiconductor pattern; a display element layer on the circuit layer; and a light shielding layer between the input sensor and the display element layer and defining a plurality of holes and a cut portion spaced apart from the semiconductor pattern in a plan view (e.g., when viewed on a plane).

In an embodiment, the circuit layer may further include a conductive layer on the semiconductor pattern, and the cut portion and the conductive layer may overlap each other in a plan view (e.g., when viewed on the plane).

In an embodiment, the light shielding layer may be between the base layer and the circuit layer.

In an embodiment of the present disclosure, a display device includes: a base layer in which a first non-folding area, a folding area, and a second non-folding area are sequentially defined in a first direction; a circuit layer on the base layer and including a semiconductor pattern, an insulation layer, and a conductive layer; a display element layer on the circuit layer; and a light shielding layer defining a cut portion extending in a second direction crossing the first direction in an area overlapping the folding area, and defining a plurality of holes in an area overlapping the first non-folding area and the second non-folding area.

In an embodiment, the cut portion may not overlap the semiconductor pattern in a plan view (e.g., when viewed on a plane), and the cut portion may overlap the conductive layer in the plan view (e.g., when viewed on the plane).

In an embodiment, the display device may further include an input sensor below the base layer, and the input sensor may be in an area overlapping at least one of the first non-folding area or the second non-folding area.

In an embodiment, the light shielding layer may be between the base layer and the circuit layer.

BRIEF DESCRIPTION OF THE FIGURES

The accompanying drawings are included to provide a further understanding of the present disclosure, and are incorporated in and constitute a part of this specification. The drawings illustrate example embodiments of the present disclosure and, together with the written description, serve to explain features, aspects and/or principles of the present disclosure. In the drawings:

FIG. 3B is a cross-sectional view illustrating a display device according to an embodiment of the present disclosure;

DETAILED DESCRIPTION

Figure 1A:
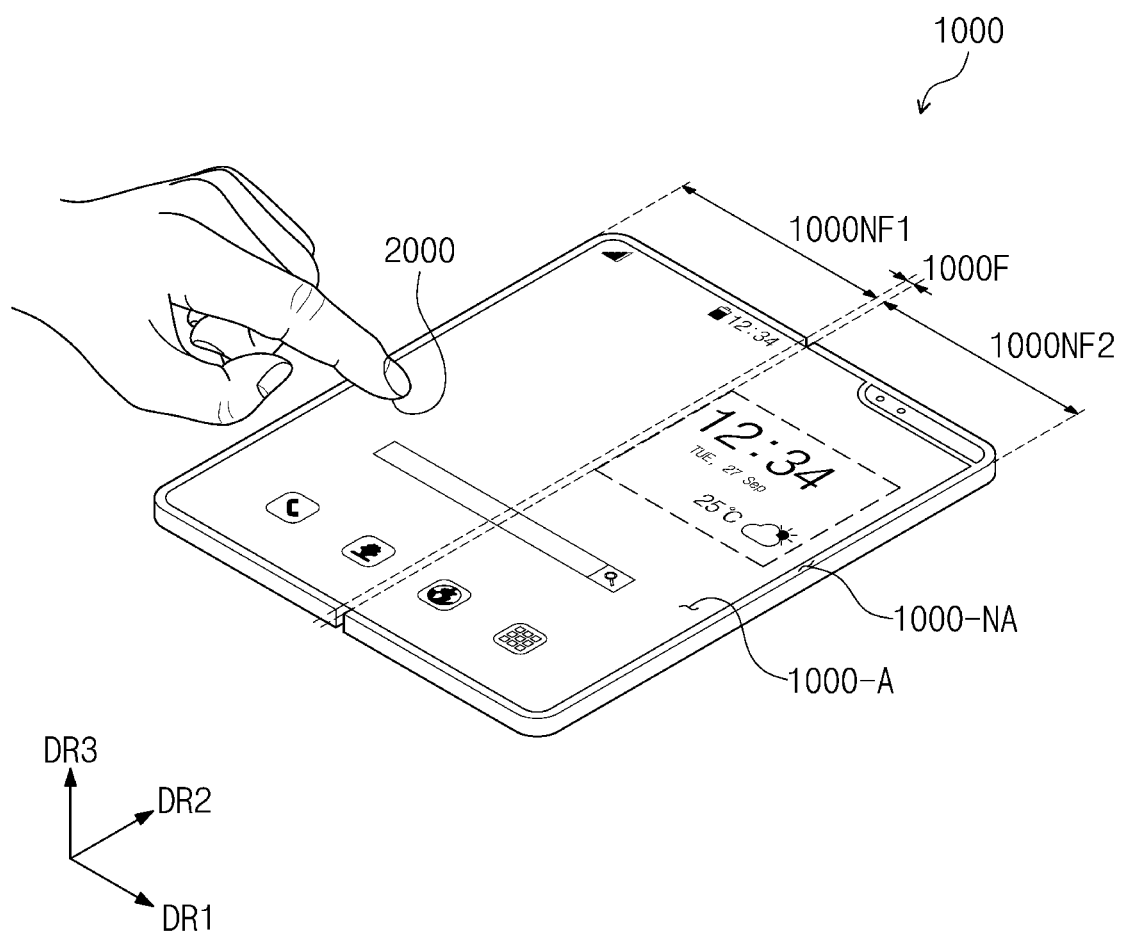
FIG. 1A is a perspective view illustrating a display device according to an embodiment of the present disclosure.

Hereinafter, example embodiments will be described in more detail with reference to the accompanying drawings. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described.

The terminology used herein is for the purpose of describing particular embodiments only and is not intended to be limiting of the present disclosure. Expressions such as "at least one of," when preceding a list of elements, modify the entire list of elements and do not modify the individual elements of the list.

In this specification, it will also be understood that when one component (or region, layer, portion) is referred to as being cony, 'connected to', or 'coupled to' another component, it can be directly disposed/connected/coupled on/to the one component, or one or more intervening third component(s) may also be present.

Like reference numerals refer to like elements throughout and thus, repeated description thereof may be omitted. Also, in the figures, the thickness, ratio, and dimensions of components may be exaggerated for clarity of illustration.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless to the context clearly indicates the contrary.

Also, "under", "below", "above', "upper", and the like are used for explaining relational associations of components illustrated in the drawings. The terms may be a relative concept and described based on directions expressed in the drawings.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

The meaning of 'include' or 'comprise' specifies a property, a fixed number, a step, an operation, an element, a component or a combination thereof, but does not exclude other properties, fixed numbers, steps, operations, elements, components or combinations thereof.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present disclosure.

Hereinafter, embodiments of the present disclosure will be described with reference to the accompanying drawings.

Figure 1B:
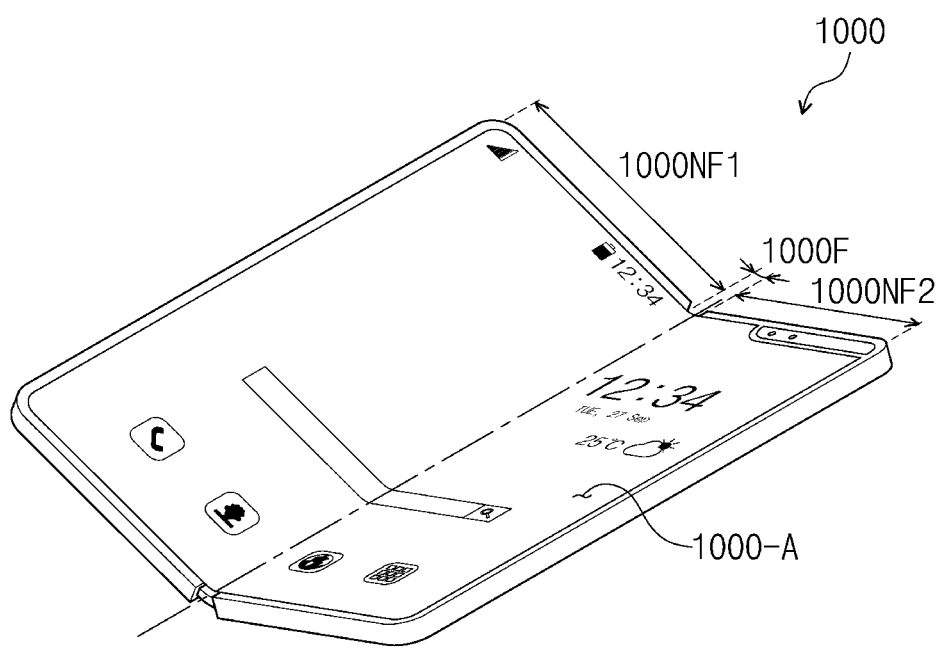
FIG. 1B is an operation state view of the display device according to an embodiment of the present disclosure.

FIG. 1A is a perspective view illustrating a display device 1000 according to an embodiment of the present disclosure. FIG. 1B is an operation state view of the display device 1000 according to an embodiment of the present disclosure.

Referring to FIGS. 1A and 1B, the display device 1000 may be activated by an electrical signal. Although the display device 1000 may be a mobile phone, a tablet computer, a navigation unit for a vehicle, a game console, or a wearable device, as examples, the embodiments of the present disclosure are not limited thereto. FIG. 1A illustrates a mobile phone as an example of the display device 1000.

The display device 1000 may be a foldable display device. In the display device 1000, a first non-folding area 1000NF1, a folding area 1000F, and a second non-folding area 1000NF2 may be sequentially defined in a first direction DR1. That is, the folding area 1000F may be defined between the first non-folding area 1000NF1 and the second non-folding area 1000NF2.

In the display device 1000, a display area 1000-A and a non-display area 1000-NA may be defined. The non-display area 1000-NA may surround the display area 1000-A. The display device 1000 may display an image through the display area 1000-A. In an unfolded state, the display area 1000-A may include a surface parallel to a plane defined by a first direction DR1 and a second direction DR2. The display device 1000 may have a thickness direction parallel to a third direction DR3 crossing the first direction DR1 and the second direction DR2. Thus, a front surface (or a top surface) and a rear surface (or a bottom surface) of each of members of the display device 1000 may be defined with respect to the third direction DR3.

When the display device 1000 is folded, a display surface of the first non-folding area 1000NF1 and a display surface of the second non-folding area 1000NF2 may face each other. Thus, the display area 1000-A may not be exposed to the outside in a state in which the display device 1000 is completely folded. This state may be referred to as in-folding. However, this is merely an example, and the embodiments of the present disclosure are not limited thereto.

In another embodiment, when the display device 1000 is folded, the display surface of the first non-folding area 1000NF1 and the display surface of the second non-folding area 1000NF2 may be opposite to each other. Thus, the display area 1000-A in a folded state may be exposed to the outside. This state may be referred to as out-folding. Also, the display device 1000 may be capable of both in-folding and the out-folding.

The display device 1000 according to an embodiment of the present disclosure may sense a user's input applied from the outside. For example, the user's input includes various kinds (types) of external inputs such as a portion of a user's body, light, heat, or pressure. The display area 1000-A of the display device 1000 may sense the user's input. Also, the display device 1000 may sense a user's fingerprint 2000 applied from the outside. A fingerprint sensing area for sensing the user's fingerprint 2000 may correspond to a partial area of the display area 1000-A. For example, the fingerprint sensing area may correspond to the first non-folding area 1000NF1 and the second non-folding area 1000NF2.

Figure 2A:
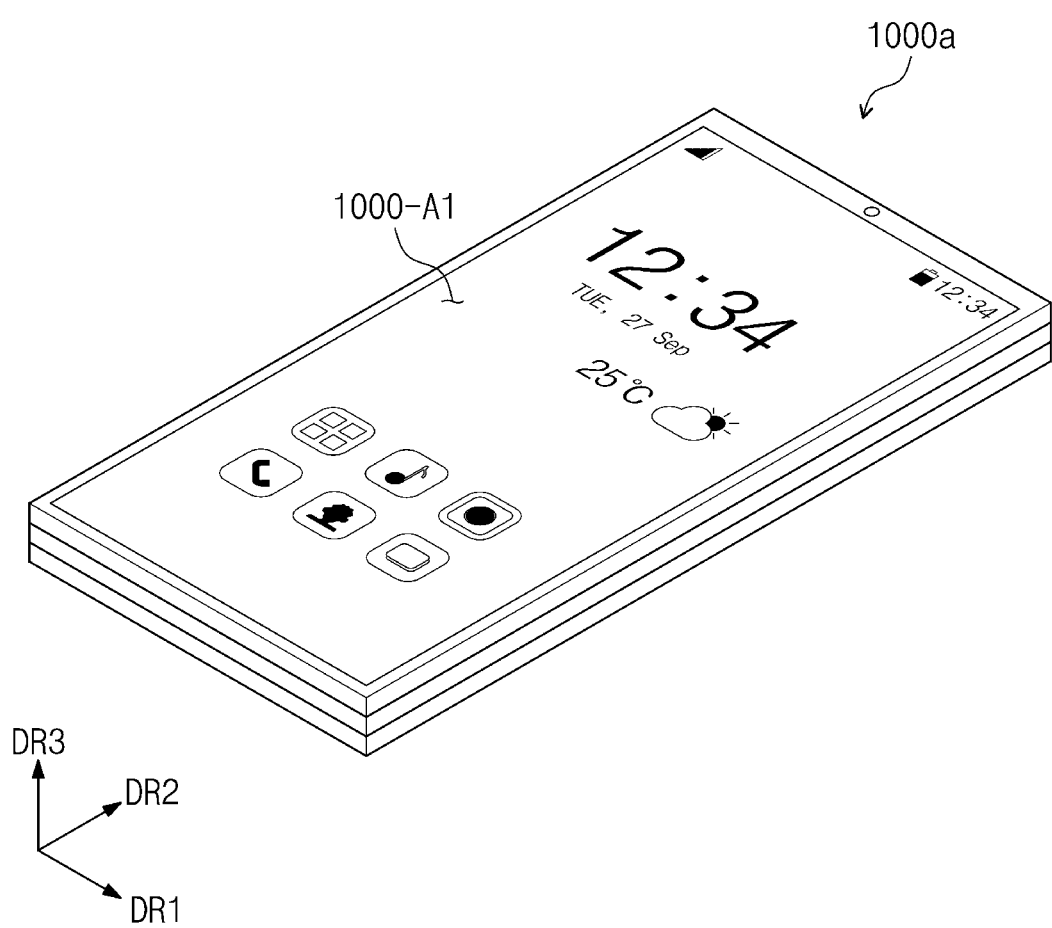
FIG. 2A is a perspective view illustrating a display device according to an embodiment of the present disclosure.
Figure 2B:
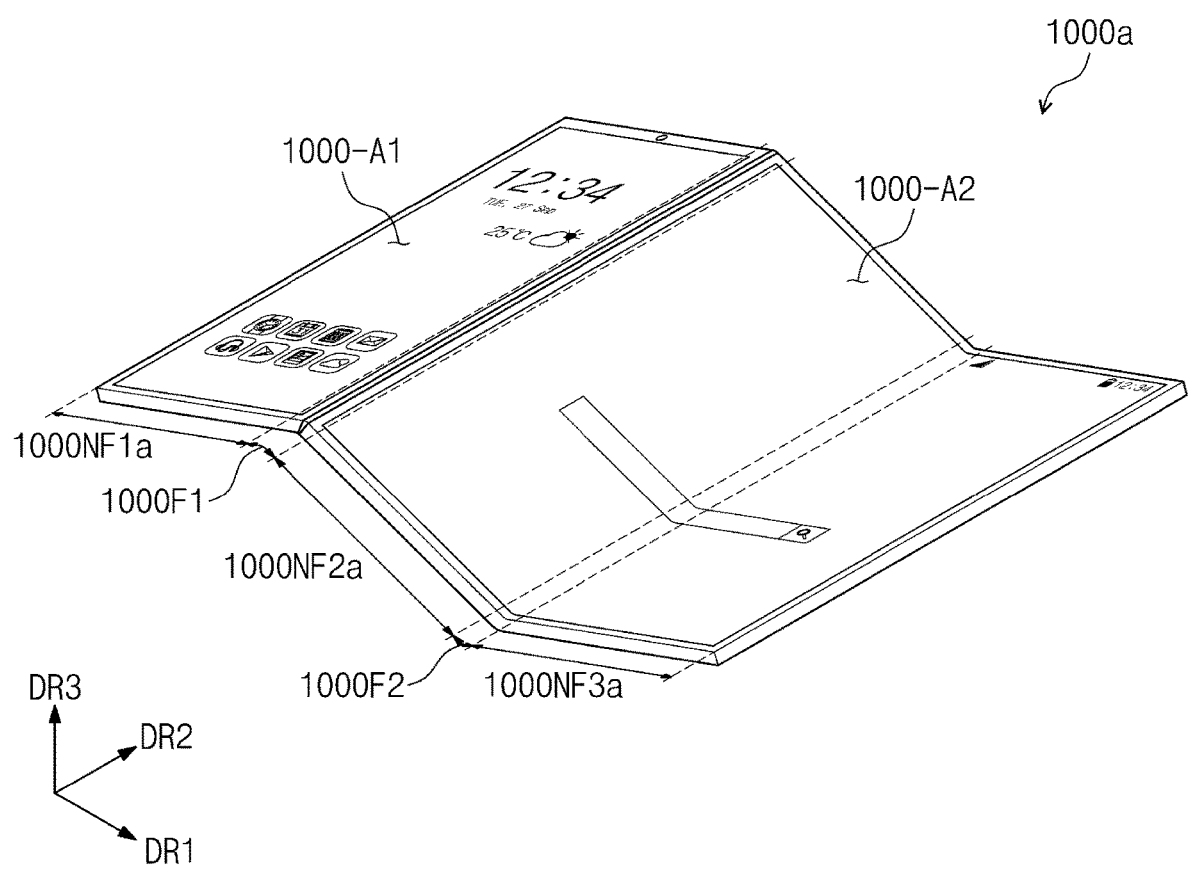
FIG. 2B is an operation state view of the display device according to an embodiment of the present disclosure.

FIG. 2A is a perspective view illustrating a display device 1000a according to an embodiment of the present disclosure. FIG. 2B is an operation state view of the display device 1000a according to an embodiment of the present disclosure.

Referring to FIGS. 2A and 2B, the display device 1000a may be a multi-foldable display device. In the display device 1000a, a first non-folding area 1000NF1a, a folding area 1000F1, a second non-folding area 1000NF2a, a second folding area 1000F2, and a third non-folding area 1000NF3a may be sequentially defined in a first direction DR1. That is, a plurality of folding areas 1000F1 and 1000F2 may be defined in the display device 1000a.

The display device 1000a may display an image through first and second display areas 1000-A1 and 1000-A2. Although FIGS. 2A and 2B provide an example in which the first display area 1000-A1 and the second display area 1000-A2 are discontinuous, the embodiments of the present disclosure are not limited thereto. For example, the first display area 1000-A1 and the second display area 1000-A2 may be continuous to each other in an embodiment of the present disclosure.

A boundary between the first display area 1000-A1 and the second display area 1000-A2 may overlap the first folding area 1000F1, and the second folding area 1000F2 may be defined in the second display area 1000-A2. The first folding area 1000F1 may be out-folded, and the second folding area 1000F2 may be in-folded.

Figure 3A:
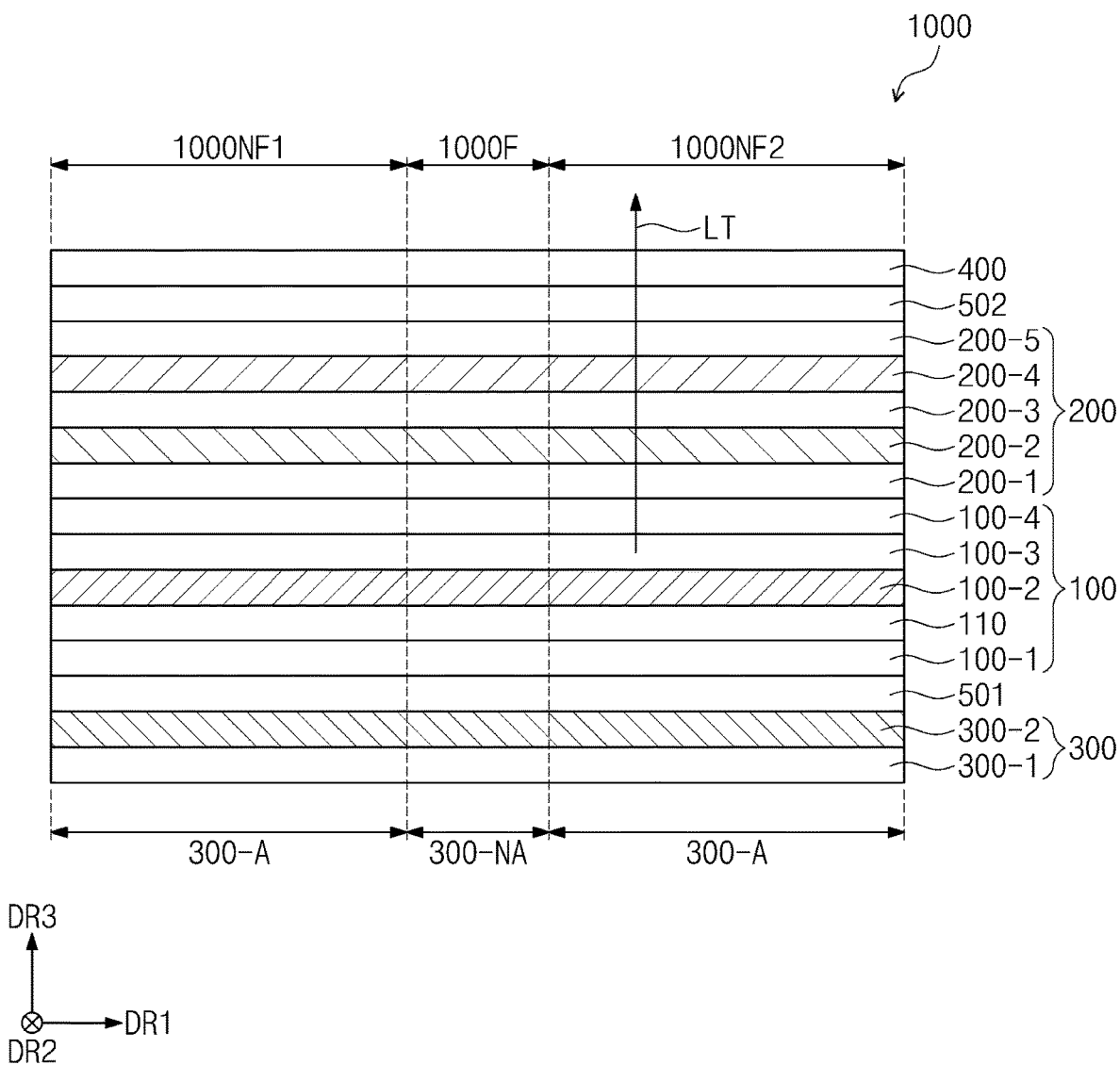
FIG. 3A is a cross-sectional view illustrating the display device according to an embodiment of the present disclosure.

FIG. 3A is a cross-sectional view illustrating the display device 1000 according to an embodiment of the present disclosure.

Referring to FIG. 3A, the display device 1000 may include a display panel 100, a first input sensor 200, a second input sensor 300, and a window 400. Hereinafter, although the display device 1000 in FIGS. 1A and 1B will be described, features to be described may be also applied to the display device 1000a in FIGS. 2A and 2B.

The display panel 100 may be a component that substantially generates an image. For example, a display area and a non-display area may be also defined in the display panel 100. The display area of the display panel 100 may correspond to the display area 1000-A (refer to FIG. 1A) of the display device 1000 (as shown, for example, in FIG. 1A), and the non-display area of the display panel 100 may correspond to the non-display area 1000-NA (as shown, for example, in FIG. 1A) of the display device 1000 (as shown, for example, in FIG. 1A).

The display panel 100 may be a light emitting display panel. For example, the display panel 100 may be an organic light emitting display panel or a quantum dot light emitting display panel. Alternatively, the display panel 100 may be a light receiving display panel. For example, the display panel 100 may be a liquid crystal display panel.

A folding area and non-folding areas may be defined in the display panel 100 and correspond to the folding area 1000F and the first and second non-folding areas 1000NF1 and 1000NF2 of the display device 1000, respectively.

The display panel 100 may include a base layer 100-1, a light shielding layer 110, a circuit layer 100-2, a display element layer 100-3, and an encapsulation layer 100-4, and detailed description thereof will be described with reference to FIG. 4.

The display element layer 100-3 may include a light emitting layer EML (as shown, for example, in FIG. 4) that provides light LT. The display element layer 100-3 may provide light LT in a direction toward the first input sensor 200. The light LT provided from the display element layer 100-3 may be outputted to the outside through the first input sensor 200 and the window 400.

The first input sensor 200 may be disposed on the display panel 100. The first input sensor 200 may sense an external input applied from the outside. The external input may be an input of a user. For example, the input of the user may include various types of external inputs such as a portion of a user's body, light, heat, a pen, or pressure. The first input sensor 200 may be referred to as a touch panel, a touch sensing layer, or an input sensing layer.

The first input sensor 200 may be provided on the display panel 100 through a continuous process. Alternatively, the first input sensor 200 may be coupled with the display panel 100 through an adhesive member. The adhesive member may include a typical adhesive or sticking agent. For example, the adhesive member may be a transparent adhesive member such as a pressure sensitive adhesive film (PSA), an optically clear adhesive film (OCA), or an optically clear resin (OCR).

The first input sensor 200 may include a base insulation layer 200-1, a first conductive layer 200-2, a sensing insulation layer 200-3, a second conductive layer 200-4, and a cover insulation layer 200-5.

The first conductive layer 200-2 may be disposed on the base insulation layer 200-1. The sensing insulation layer 200-3 may be disposed on the first conductive layer 200-2. The second conductive layer 200-4 may be disposed on the sensing insulation layer 200-3. The cover insulation layer 200-5 may be disposed on the second conductive layer 200-4.

The base insulation layer 200-1 may be an inorganic layer including one of a silicon nitride, a silicon oxynitride, and a silicon oxide. Alternatively, the base insulation layer 200-1 may be an organic layer including an epoxy resin, an acrylic resin, or an imide-based resin. The base insulation layer 200-1 may have a single-layer structure or a lamination structure laminated in the third direction DR3.

The base insulation layer 200-1 may be provided directly on the display panel 100. Alternatively, the base insulation layer 200-1 may be one component of the display panel 100. Alternatively, the base insulation layer 200-1 may be provided on a separate base layer, and the base layer may be coupled with the display panel 100 through an adhesive member.

Each of the first conductive layer 200-2 and the second conductive layer 200-4 may have a single-layer structure or a multi-layer structure laminated in the third direction DR3. The first conductive layer 200-2 and/or second conductive layer 200-4 having the single-layer structure may include (e.g., consist of) a metal layer or a transparent conductive layer. The metal layer may contain molybdenum, silver, titanium, copper, aluminum, and/or an alloy thereof. The transparent conductive layer may contain a transparent conductive oxide such as an indium tin oxide (ITO), an indium zinc oxide (IZO), a zinc oxide (ZnO), and/or an indium zinc tin oxide (IZTO). In some embodiments, the transparent conductive layer may contain a conductive polymer such as PEDOT, a metal nano-wire, or graphene.

The first conductive layer 200-2 and/or second conductive layer 200-4 having the multi-layer structure may include metal layers. The metal layers may have, e.g., a three-layer structure of titanium/aluminum/titanium. The first conductive layer 200-2 and/or second conductive layer 200-4 having the multi-layer structure may include at least one metal layer and at least one transparent conductive layer.

Each of the first conductive layer 200-2 and the second conductive layer 200-4 may include at least a portion of first sensing electrodes and second sensing electrodes. The first input sensor 200 may obtain information about an external input through variation of mutual capacitance between the first sensing electrodes and the second sensing electrodes.

At least one of the sensing insulation layer 200-3 or the cover insulation layer 200-5 may include an inorganic layer. The inorganic layer may contain at least one of an aluminum oxide, a titanium oxide, a silicon oxide, a silicon oxynitride, a zirconium oxide, or a hafnium oxide.

At least one of the sensing insulation layer 200-3 or the cover insulation layer 200-5 may include an organic layer. The organic layer may contain at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyimide-based resin, or a perylene-based resin.

The second input sensor 300 may be disposed below the display panel 100. The second input sensor 300 may sense user's biometric authentication information applied from the outside. For example, the biometric authentication information may be a fingerprint. The second input sensor 300 may sense a surface of a touch object. The surface may include a surface uniformity or a wavy surface shape. For example, the surface may include information of a user's fingerprint 2000 (as shown, for example, in FIG. 1A). The second input sensor 300 may be referred to as a fingerprint sensing panel, a fingerprint sensing layer, or an input sensor.

Sensing areas 300-A and a non-sensing area 300-NA may be defined in the second input sensor 300. The sensing areas 300-A may overlap the first and second non-folding areas 1000NF1 and 1000NF2, respectively. The non-sensing area 300-NA may overlap the folding area 1000F. A sensing element for sensing a fingerprint, e.g., photodiodes, may be disposed on the sensing areas 300-A, and the photodiodes may not be disposed on the non-sensing area 300-NA.

The second input sensor 300 may include a base layer 300-1 and a biometric information sensing layer 300-2.

The base layer 300-1 may include a synthetic resin layer. The synthetic resin layer may contain a thermosetting resin. Although the synthetic resin layer may include a polyimide-based resin layer, the embodiments of the present disclosure are not limited to the material of the synthetic resin layer. For example, the base layer 300-1 may include two layers of polyimide-based resin layers and a barrier layer disposed between the polyimide-based resin layers. The barrier layer may contain amorphous silicon and a silicon oxide.

The biometric information sensing layer 300-2 may be disposed on the base layer 300-1. The biometric information sensing layer 300-2 may include a sensing circuit and insulation layers. The sensing circuit may include at least one transistor and at least one photodiode.

The second input sensor 300 may be an image sensor that is provided as a unit component (or module). For example, the second input sensor 300 may be a CMOS image sensor. When the module-type second input sensor 300 is provided, the second input sensor 300 may be disposed below the display panel 100. The second input sensor 300 may be attached to or may not be attached to the display panel 100.

The window 400 may be disposed on the first input sensor 200. The window 400 may contain an optically transparent insulating material. For example, the window 400 may contain glass or plastic. The window may have a multi-layer structure or a single-layer structure. For example, the window 400 may include a plurality of plastic films coupled by an adhesive, or a glass substrate and a plastic film, which are coupled by an adhesive.

A first adhesive layer 501 may be disposed between the display panel 100 and the second input sensor 300. A second adhesive layer 502 may be disposed between the window 400 and the first input sensor 200. Each of the first adhesive layer 501 and the second adhesive layer 502 may include a typical adhesive or sticking agent. For example, the adhesive member may be a transparent adhesive member such as a pressure sensitive adhesive film (PSA), an optically clear adhesive film (OCA), or an optically clear resin (OCR).

In an embodiment of the present disclosure, one of the first and second adhesive layers 501 and 502 may be omitted. When the first adhesive layer 501 is omitted, the second input sensor 300 and the display panel 100 may be provided through a continuous process. When the second adhesive layer 502 is omitted, the first input sensor 200 and the window 400 may be provided through a continuous process.

FIG. 3B is a cross-sectional view illustrating a display device 1000-1 according to an embodiment of the present disclosure.

Referring to FIG. 3B, the display device 1000-1 may include a display panel 100, a first input sensor 200, second input sensors 300a and 300b, and a window 400.

The second input sensors 300a and 300b may overlap the first and second non-folding areas 1000NF1 and 1000NF2, respectively. The second input sensors 300a and 300b may be spaced apart from each other with the folding area 1000F therebetween. The second input sensors 300a and 300b may not overlap the folding area 1000F.

Each of the second input sensors 300a and 300b may include a base layer 300-1 and a biometric information sensing layer 300-2. First adhesive layers 501a and 501b may be disposed between the display panel 100 and the second input sensors 300a and 300b.

Figure 3C:
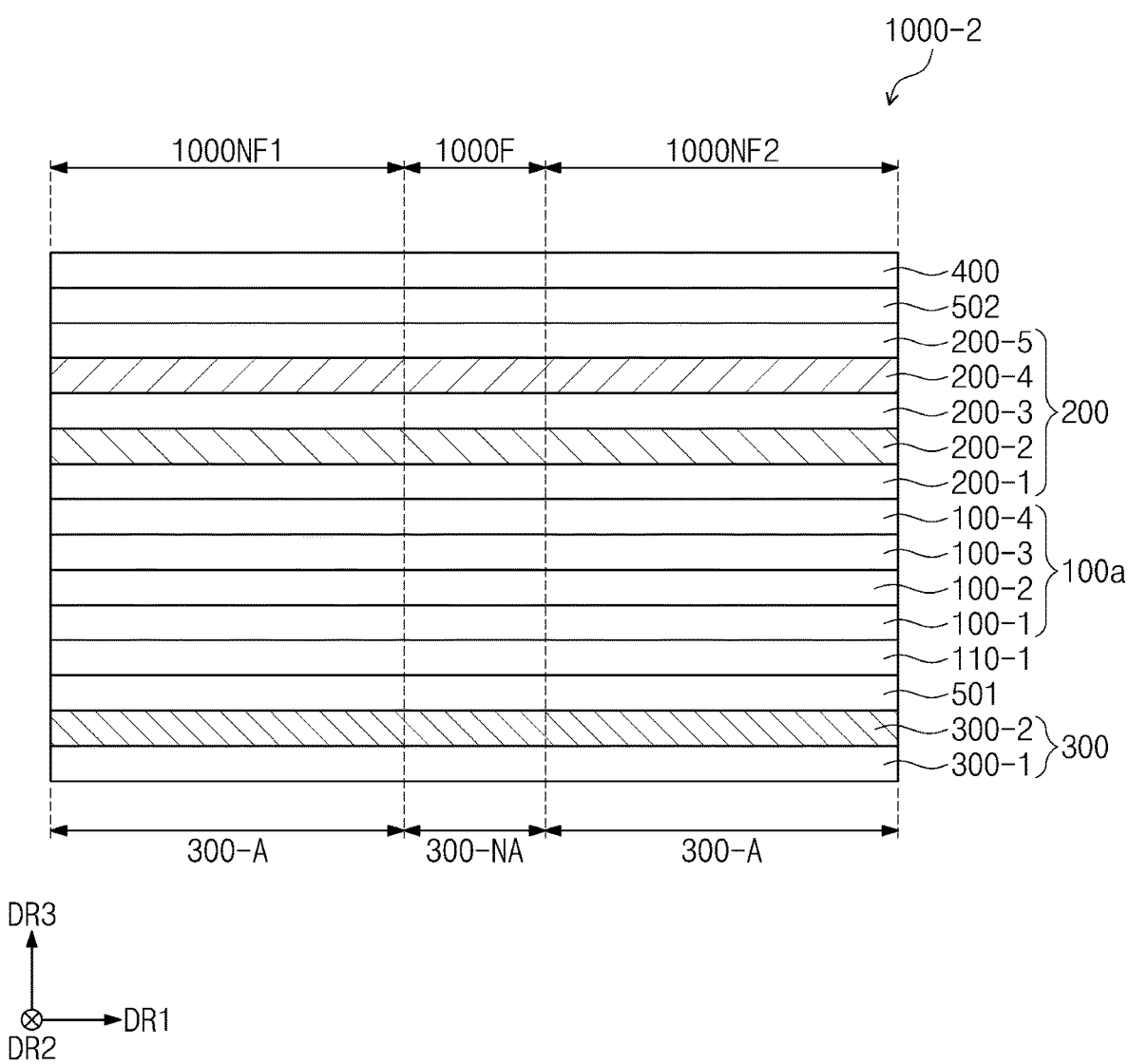
FIG. 3C is a cross-sectional view illustrating a display device according to an embodiment of the present disclosure.

FIG. 3C is a cross-sectional view illustrating a display device 1000-2 according to an embodiment of the present disclosure.

Referring to FIG. 3C, the display device 1000-2 may include a display panel 100a, a light shielding layer 110-1, a first input sensor 200, a second input sensor 300, and a window 400.

The light shielding layer 110-1 may be disposed below the display panel 100a. For example, the light shielding layer 110-1 may be provided directly on a bottom surface of the base layer 100-1. However, the embodiments of the present disclosure are not limited thereto. For example, the light shielding layer 110-1 may be attached to the bottom surface of the base layer 100-1 through an adhesive layer. Also, the position of the light shielding layer 110-1 may be variously changed as long as the light shielding layer 110-1 is disposed between a display element layer 100-3 and the second input sensor 300.

Figure 4:
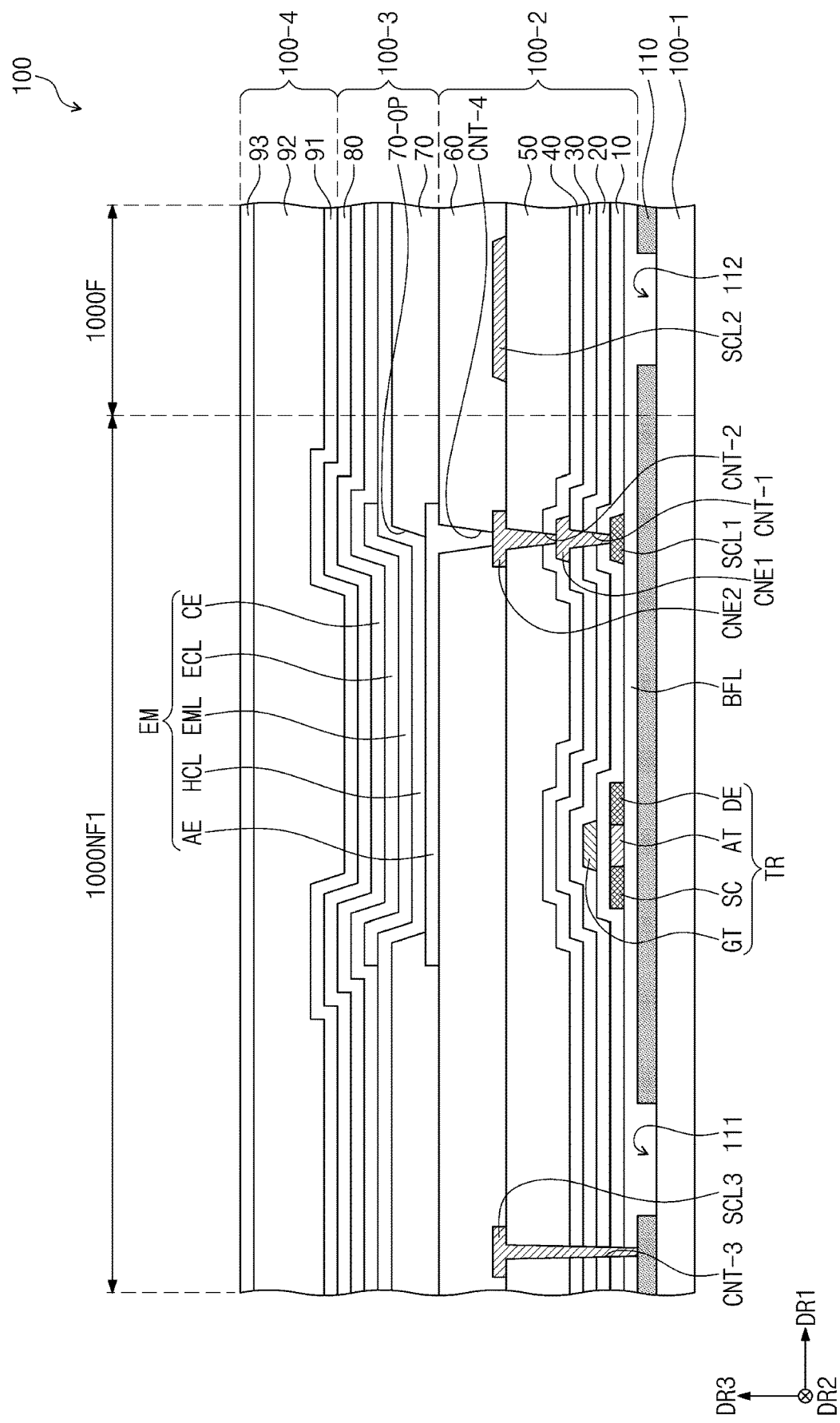
FIG. 4 is a cross-sectional view illustrating a display panel according to an embodiment of the present disclosure.
Figure 5:
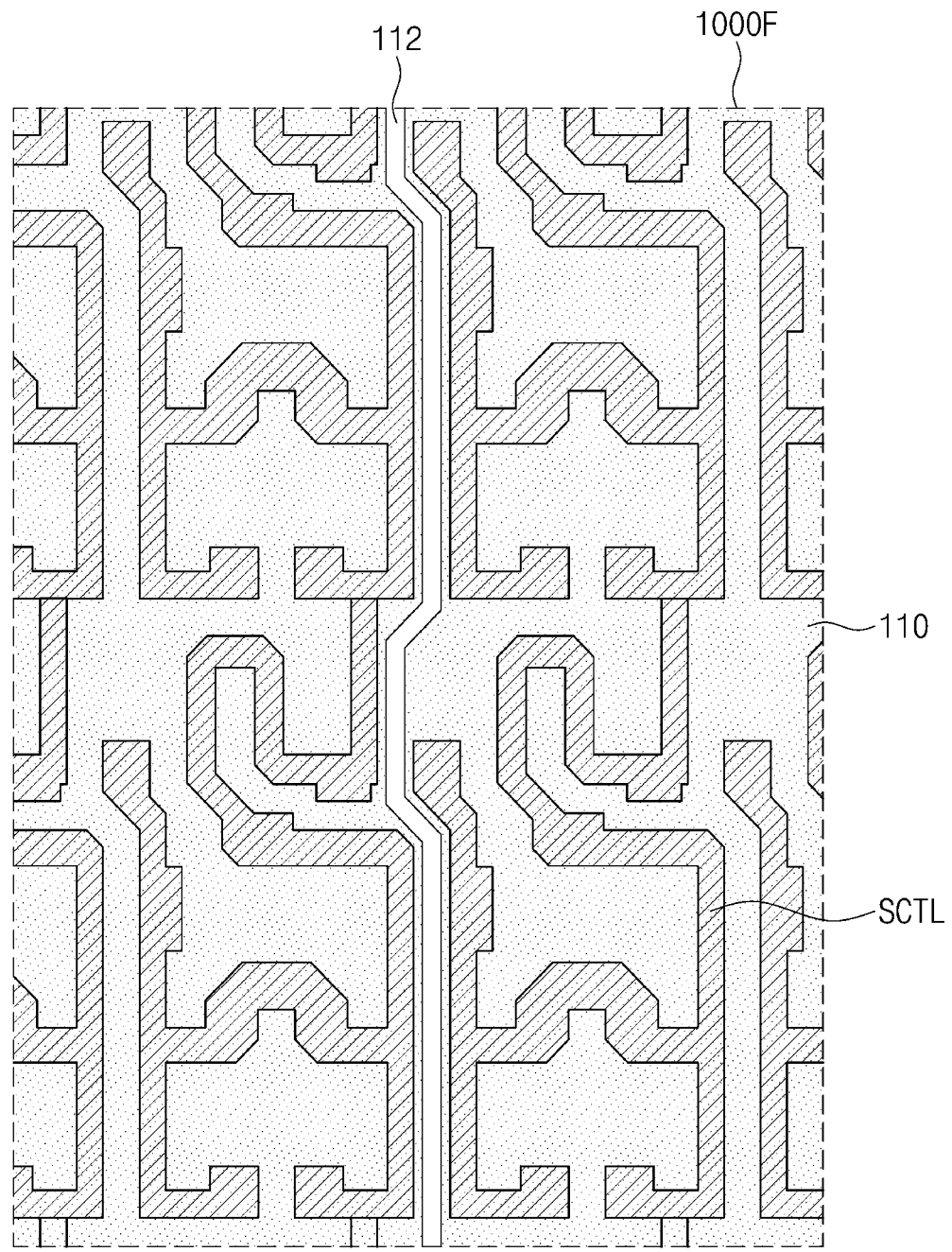
FIG. 5 is a plan view illustrating a partial configuration of the display panel according to an embodiment of the present disclosure.

FIG. 4 is a cross-sectional view illustrating the display panel 100 according to an embodiment of the present disclosure. FIG. 5 is a plan view illustrating a partial configuration of the display panel 100 according to an embodiment of the present disclosure.

Referring to FIG. 4, the display panel 100 may include a plurality of insulation layers, a semiconductor pattern, a conductive pattern, a signal line, etc. The insulation layer, the semiconductor pattern, and the conductive layer are provided by a method such as coating and deposition. Thereafter, the insulation layer, the semiconductor pattern, and the conductive layer may be selectively patterned by a photolithography method. By using the above-described method, the semiconductor pattern, the conductive pattern, and the signal line, which are contained in the circuit layer 100-2 and the display element layer 100-3, are provided. Thereafter, the encapsulation layer 100-4 covering the display element layer 100-3 may be provided.

The light shielding layer 110 may be disposed on the base layer 100-1. The light shielding layer 110 may contain a low reflection material. Although the light shielding layer 110 may contain molybdenum or titanium, as an example, the embodiments of the present disclosure are not limited thereto.

A plurality of holes 111 and at least one cut portion 112 may be defined in the light shielding layer 110. The plurality of holes 111 may overlap the first and second non-folding areas 1000NF1 and 1000NF2, and the cut portion 112 may overlap the folding area 1000F.

Each of the plurality of holes 111 may have a size equal to or less than a set or predetermined size. Each of the plurality of holes 111 may be referred to as a pin-hole.

A portion of light reflected from a fingerprint 2000 may be incident to the second input sensor 300 (shown, for example, in FIG. 3A) through the plurality of holes 111. An incident angle of light, which allows the light to transmit through the plurality of holes 111, may be controlled by sizes of the plurality of holes 111 and a thickness of the light shielding layer 110. According to an embodiment of the present disclosure, only light incident with a set or predetermined incident angle may be incident to the second input sensor 300 (shown, for example, in FIG. 3A) by the light shielding layer 110 contained in the display panel 100. Thus, an accuracy and a sensitivity of fingerprint recognition may improve.

According to an embodiment of the present disclosure, the light shielding layer 110 for adjusting an incident angle of light incident to the second input sensor 300 (shown, for example, in FIG. 3A) is provided in the display panel 100. Aligning the plurality of holes 111 provided in the light shielding layer 110 with components in the display panel 100 may be easier than attaching the light shielding layer 110, which is separately manufactured, to the display panel 100.

The cut portion 112 may include a portion extending in a set or predetermined direction. For example, a portion of the cut portion may have a shape extending in the second direction DR2. In this specification, extending in a specific direction represents having a tendency to extend in a specific direction instead of a situation in which an extending object is parallel to a specific direction. In some embodiments, the cut portion 112 may have an area greater than that of each of the plurality of holes 111.

When the light shielding layer 110 is made of metal, the light shielding layer 110 may have a modulus greater than other insulation layers. Thus, a stress applied to the light shielding layer 110 when the display panel 100 is folded may be greater than other insulation layers. According to an embodiment of the present disclosure, because the cut portion 112 is provided at one area of the light shielding layer 110 overlapping the folding area 1000F, stress generated in the light shielding layer 110 in the folding area 1000F may be reduced.

At least one inorganic layer is provided on a top surface of the base layer 100-1. The inorganic layer may contain at least one of an aluminum oxide, a titanium oxide, a silicon oxide, a silicon oxynitride, a zirconium oxide, or a hafnium oxide. The inorganic layer may have multiple layers. The multilayered inorganic layers may provide a barrier layer and/or a buffer layer. In this embodiment, the display panel 100 includes a buffer layer BFL.

The buffer layer BFL may be disposed on the base layer 100-1 while covering the light shielding layer 110. The buffer layer BFL improves a coupling force between the base layer 100-1 and the semiconductor pattern. The buffer layer BFL may include a silicon oxide layer and a silicon nitride layer. Here, the silicon oxide layer and the silicon nitride layer may be alternately laminated with each other.

Referring to FIGS. 4 and 5, a semiconductor pattern SCTL is disposed on the buffer layer BFL. The semiconductor pattern SCTL may be represented in FIG. 4 by a transistor TR discussed further below. The semiconductor pattern SCTL may contain polysilicon. However, the embodiments of the present disclosure are not limited thereto. For example, the semiconductor pattern SCTL may contain amorphous silicon or a metal oxide.

FIGS. 4 and 5 merely illustrate a portion of the semiconductor pattern SCTL. The semiconductor pattern SCTL may be further disposed on another area. The semiconductor pattern SCTL may be arranged over pixels based on a particular rule. The semiconductor pattern SCTL may have an electrical property that is different according to whether it is doped or not. The semiconductor pattern may include a doped area and a non-doped area. The doped area may be doped with a n-type dopant or a p-type dopant. A p-type transistor may include a doped area that is doped with the p-type dopant, and a n-type transistor may include a doped area that is doped with the n-type dopant.

The doped area may have a conductivity greater than that of the non-doped area and substantially serve as an electrode or a signal line. The non-doped area substantially corresponds to an active (or channel) of the transistor TR, as shown, for example, in FIG. 4. In other words, one portion of the semiconductor pattern SCTL may be an active AT, another portion may be a source SC or a drain DE of the transistor TR, and another portion may be a connection electrode or a first signal line SCL1.

As illustrated in FIG. 4, the source SC, the active AT, and the drain DE of the transistor TR may be provided as part of the semiconductor pattern SCTL. The source SC and the drain DE may extend from the active AT in opposite directions on a cross-section. FIG. 4 illustrates a portion of a first signal line SCL1 provided as part of the semiconductor pattern SCTL. Although not separately shown, the first signal line SCL1 may be connected to the drain DE of the transistor TR on a plane.

In this specification, "in a plan view", "on a plane", or the like may refer to that "when viewed on a plane", "when viewed in the third direction DR3", or "when viewed in the thickness direction of the display device 1000 (see, e.g., FIG. 1A)".

Referring to FIG. 5, the cut portion 112 may not overlap the semiconductor pattern SCTL. Thus, an image quality of the display panel 100 may be minimally affected by the cut portion 112.

A first insulation layer 10 may be disposed on the buffer layer BFL. The first insulation layer 10 may overlap a plurality of pixels in common and cover the semiconductor pattern SCTL. The first insulation layer 10 may be an inorganic layer and/or an organic layer and have a single-layer or multilayer structure. The first insulation layer 10 may contain at least one of an aluminum oxide, a titanium oxide, a silicon oxide, a silicon oxynitride, a zirconium oxide, or a hafnium oxide. In this embodiment, the first insulation layer 10 may be a single-layered silicon oxide layer. In addition to the first insulation layer 10, other insulation layers of the circuit layer 100-2, which are described below, may be an inorganic layer and/or an organic layer and have a single-layer or multi-layer structure. Although the inorganic layer may contain at least one of the above-described materials, the embodiments of the present disclosure are not limited thereto.

A gate GT is disposed on the first insulation layer 10. The gate GT may be a portion of a metal pattern. The gate GT overlaps the active AT. The gate GT may function as a mask in a process of doping the semiconductor pattern SCTL.

A second insulation layer 20 may be disposed on the first insulation layer 10 to cover the gate GT. The second insulation layer 20 may overlap the pixels in common. The second insulation layer 20 may be an inorganic layer and/or an organic layer and have a single-layer or multi-layer structure. In this embodiment, the second insulation layer 20 may be a single-layered silicon oxide layer.

A third insulation layer 30 may be disposed on the second insulation layer 20. In some embodiments, an electrode layer may be disposed between the second insulation layer 20 and the third insulation layer 30. In this embodiment, the third insulation layer 30 may be a single-layered silicon oxide layer.

A first connection electrode CNE1 may be disposed on the third insulation layer 30. The first connection electrode CNE1 may be connected to a first signal line SCL1 through a contact hole CNT-1 passing through the first to third insulation layers 10 to 30.

A fourth insulation layer 40 may be disposed on the third insulation layer 30. The fourth insulation layer 40 may be a single-layered silicon oxide layer. A fifth insulation layer 50 may be disposed on the fourth insulation layer 40. The fifth insulation layer 50 may be an organic layer.

A second connection electrode CNE2, a second signal line SCL2, and a third signal line SCL3 may be disposed on the fifth insulation layer 50. The second connection electrode CNE2 may be connected to the first connection electrode CNE1 through a contact hole CNT-2 passing through the fourth insulation layer 40 and the fifth insulation layer 50.

The second signal line SCL2 may be one of the data lines or scan lines of the display panel 100. The second signal line SCL2 may be disposed on the cut portion 112 to cover the cut portion 112. Thus, a possibility of the cut portion 112 being seen from the outside may be reduced.

In an embodiment of the present disclosure, the second signal line SCL2, the third signal line SCL3, and the second connection electrode CNE2 disposed on the fifth insulation layer 50 may provide one conductive layer. That is, the cut portion 112 may be covered by one portion of the conductive layer. Alternatively, the cut portion 112 may be covered by a conductive layer disposed between the first insulation layer 10 and the second insulation layer 20, e.g., a conductive pattern disposed on the same layer as the gate GT. Alternatively, the cut portion 112 may be covered by a conductive layer disposed between the third insulation layer 30 and the fourth insulation layer 40, e.g., a conductive pattern disposed on the same layer as the first connection electrode CNE1.

The third signal line SCL3 may be electrically connected to the light shielding layer 110 through a contact hole CNT-3 passing through the first to fifth insulation layers 10, 20, 30, 40, and 50. That is, the light shielding layer 110 may be electrically connected to the circuit layer 100-2. The third signal line SCL3 may be a ground line or a constant voltage line. For example, a set or predetermined voltage, e.g., a constant voltage, may be provided to the third signal line SCL3. As a constant voltage is provided to the light shielding layer 110, a parasitic capacitance may be reduced or prevented from being generated between the light shielding layer 110 and the circuit layer 100-2. Although an ELVDD voltage may be provided to the third signal line SCL3 as an example, the embodiments of the present disclosure are not limited thereto.

A sixth insulation layer 60 may be disposed on the fifth insulation layer 50 to cover the second connection electrode CNE2, the second signal line SCL2, and the third signal line SCL3. The sixth insulation layer 60 may be an organic layer.

A display element layer 100-3 including a light emitting element EM may be disposed on the circuit layer 100-2. The light emitting element EM may include a first electrode AE, a hole control layer HCL, a light emitting layer EML, an electron control layer ECL, and a second electrode CE.

The first electrode AE may be disposed on the sixth insulation layer 60. The first electrode AE may be connected to the second connection electrode CNE2 through a contact hole CNT-4 passing through the sixth insulation layer 60.

A pixel defining layer 70 may be disposed on the sixth insulation layer 60 to cover a portion of the first electrode AE. An opening 70-OP is defined in the pixel defining layer 70. The opening 70-OP of the pixel defining layer 70 exposes at least a portion of the first electrode AE.

The hole control layer HCL may be disposed on the first electrode AE. The hole control layer HCL may include a hole transport layer and a hole injection layer.

The light emitting layer EML may be disposed on the hole control layer HCL. The light emitting layer EML may be disposed in an area corresponding to the opening 70-OP. That is, the light emitting layer EML may be separately provided in each of the pixels. However, the embodiments of the present disclosure are not limited thereto. For example, the light emitting layer EML may be disposed in common to the pixels like the hole control layer HCL. When the light emitting layer EML is separately provided in each of the pixels, the light emitting layer EML may emit light having at least one color of blue, red, or green. When the light emitting layer EML is disposed in common to the pixels, the light emitting layer EML may provide blue light or white light.

The electron control layer ECL may be disposed on the light emitting layer EML. The electron control layer ECL may include an electron transport layer and further include an electron injection layer. The hole control layer HCL and the electron control layer ECL may be provided in common to the plurality of pixels by using an open mask.

The second electrode CE may be disposed on the electron control layer ECL. The second electrode CE may have an integrated shape and be disposed in common to the plurality of pixels.

A capping layer 80 may be disposed on the second electrode CE to contact the second electrode CE. The capping layer 80 may contain an organic material. The capping layer 80 may protect the second electrode CE from a following process, e.g., a sputtering process, and enhance a light emitting efficiency of the light emitting element EM. Although the capping layer 80 may have a refractive index greater than that of a first inorganic layer 91, which will be described later, the embodiments of the present disclosure are not limited thereto. In an embodiment of the present disclosure, the capping layer 80 may be omitted.

The encapsulation layer 100-4 may be disposed on the display element layer 100-3. The encapsulation layer 100-4 may include a first inorganic layer 91, an organic layer 92, and a second inorganic layer 93. The first inorganic layer 91 and the second inorganic layer 93 protect the display element layer 100-3 from moisture/oxygen, and the organic layer 92 may protect the display element layer 100-3 from foreign substances such as dust particles. Each of the first inorganic layer 91 and the second inorganic layer 93 may include a silicon nitride layer, a silicon oxynitride layer, a silicon oxide layer, a titanium oxide layer, or an aluminum oxide layer. Although the organic layer 92 may include an acrylic-based organic layer, the embodiments of the present disclosure are not limited thereto.

In an embodiment of the present disclosure, an inorganic layer, e.g., a LiF layer, may be further disposed between the capping layer 80 and the first inorganic layer 91. The LiF layer may enhance the light emitting efficiency of the light emitting element EM.

Figure 6:
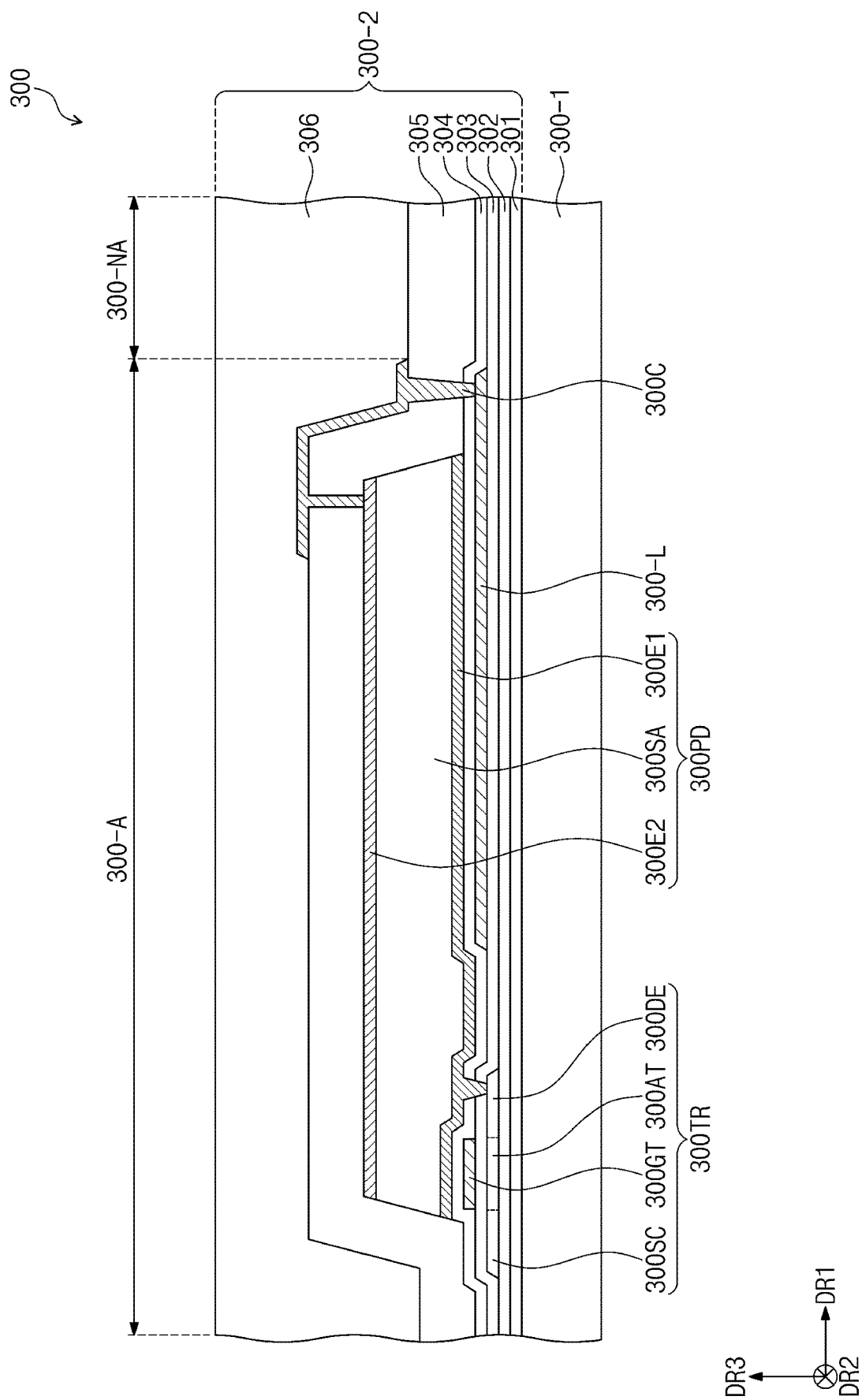
FIG. 6 is a cross-sectional view illustrating a second input sensor according to an embodiment of the present disclosure.

FIG. 6 is a cross-sectional view illustrating the second input sensor 300 according to an embodiment of the present disclosure.

Referring to FIG. 6, the second input sensor 300 may include a base layer 300-1 and a biometric information sensing layer 300-2. The biometric information sensing layer 300-2 may include a transistor 300TR and a sensing element 300PD.

A barrier layer 301 may be disposed on the base layer 300-1. A buffer layer 302 may be disposed on the barrier layer 301. The barrier layer 301 may prevent foreign substances from being introduced from the outside. The barrier layer 301 may include at least one silicon oxide layer and/or at least one a silicon nitride layer. Each of the silicon oxide layer and the silicon nitride layer may be provided in plurality, and the silicon oxide layer and the silicon nitride layer may be alternately laminated with each other. The buffer layer 302 may be disposed on the barrier layer 301. The buffer layer 302 improves a coupling force between the base layer 300-1 and the semiconductor pattern and/or the conductive pattern. The buffer layer 302 may include at least one silicon oxide layer and/or at least one silicon nitride layer. The silicon oxide layer and the silicon nitride layer may be alternately laminated with each other.

The transistor 300TR may be disposed on the buffer layer 302. The transistor 300TR may include an active 300AT, a source 300SC, a drain 300DE, and a gate 300GT. The active 300AT, the source 300SC, and the drain 300DE may be disposed on the buffer layer 302.

A first insulation layer 303 is disposed on the buffer layer 302 to cover the active 300AT, the source 300SC, and the drain 300DE. The first insulation layer 303 may be an inorganic layer and/or an organic layer and have (e.g., be) a single-layer or multi-layer structure. In this embodiment, the first insulation layer 303 may be a single-layered silicon oxide layer.

The gate 300GT and a line layer 300-L may be disposed on the first insulation layer 303. A set or predetermined voltage, e.g., a constant voltage, may be provided to the line layer 300-L. The line layer 300-L may be electrically connected to the sensing element 300PD.

A second insulation layer 304 may be disposed on the first insulation layer 303 to cover the gate 300GT and the line layer 300-L. The second insulation layer 304 may be an inorganic layer and have a single-layer or multi-layer structure. In this embodiment, the second insulation layer 304 may be a single-layered silicon oxide layer.

The sensing element 300PD may be disposed on the second insulation layer 304. The sensing element 300PD may be electrically connected to the transistor 300TR and the line layer 300-L. For example, an operation of the sensing element 300PD may be controlled by a signal provided from the transistor 300TR, and the sensing element 300PD may receive a set or predetermined voltage from the line layer 300-L.

The sensing element 300PD may be disposed in a sensing area 300-A. Also, the sensing element 300PD may not be disposed in a non-sensing area 300-NA. The sensing element 300PD may be disposed only in an area overlapping the first and second non-folding areas 1000NF1 and 1000NF2 (as shown, for example, in FIG. 3A). Thus, the sensing element 300PD may not overlap the folding area 1000F.

Light reflected by the fingerprint 2000 (as shown, for example, in FIG. 1A) may pass through the plurality of holes 111 (as shown, for example, in FIG. 4) and be incident to the sensing element 300PD. When the light incident to the sensing element 300PD has an incidence angle greater than a set or predetermined angle, light reflected from a valley of the fingerprint 2000 corresponding to the sensing element 300PD as well as light reflected from another valley adjacent to the above valley may be incident to the sensing element 300PD. This may degrade accuracy of fingerprint recognition. According to an embodiment of the present disclosure, as shown, for example, in FIG. 4, an incidence angle of light capable of passing through the plurality of holes 111 provided at the light shielding layer 110 may be restricted. Thus, only light incident at an angle equal to or less than a set or predetermined incidence angle may be incident to the sensing element 300PD by the light shielding layer 110. Thus, the accuracy or the sensitivity of fingerprint recognition may be enhanced.

The sensing element 300PD may include a first sensing electrode 300E1, a sensing layer 300SA, and a second sensing electrode 300E2.

The first sensing electrode 300E1 may pass through the first and second insulation layers 303 and 304 and be electrically connected to the transistor 300TR. The first sensing electrode 300E1 may contain an opaque conductive material. Although the first sensing electrode 300E1 may, for example, contain molybdenum, the embodiments of the present disclosure are not limited thereto.

The sensing layer 300SA may be disposed on the first sensing electrode 300E1. The sensing layer 300SA may contain amorphous silicon.

The second sensing electrode 300E2 may be disposed on the sensing layer 300SA. The second sensing electrode 300E2 may contain a transparent conductive material. For example, the second sensing electrode 300E2 may contain an indium tin oxide (ITO).

A third insulation layer 305 may be disposed on the second sensing electrode 300E2. The third insulation layer 305 may be an inorganic layer and have a single-layer or multi-layer structure. For example, the third insulation layer 305 may include a silicon oxide layer and a silicon nitride layer.

A connection electrode 300-C may be disposed on the third insulation layer 305. The connection electrode 300-C may pass through the third insulation layer 305 and be electrically connected to the second sensing electrode 300E2. Also, the connection electrode 300-C may pass through the second and third insulation layers 304 and 305 and be electrically connected to the line layer 300-L.

A fourth insulation layer 306 may be disposed on the third insulation layer 305 to cover the connection electrode 300-C. The fourth insulation layer 306 may be an organic layer and have a single-layer or multi-layer structure. For example, the fourth insulation layer 306 may be a single-layered polyimide-based resin layer.

Although FIG. 6 merely explains one example of the second input sensor 300, the embodiments of the present disclosure are not limited to the second input sensor 300 in FIG. 6. For example, the second input sensor 300 may be an image sensor that is provided as a unit component (or module). For example, the second input sensor 300 may be a CMOS image sensor.

Figure 7A:
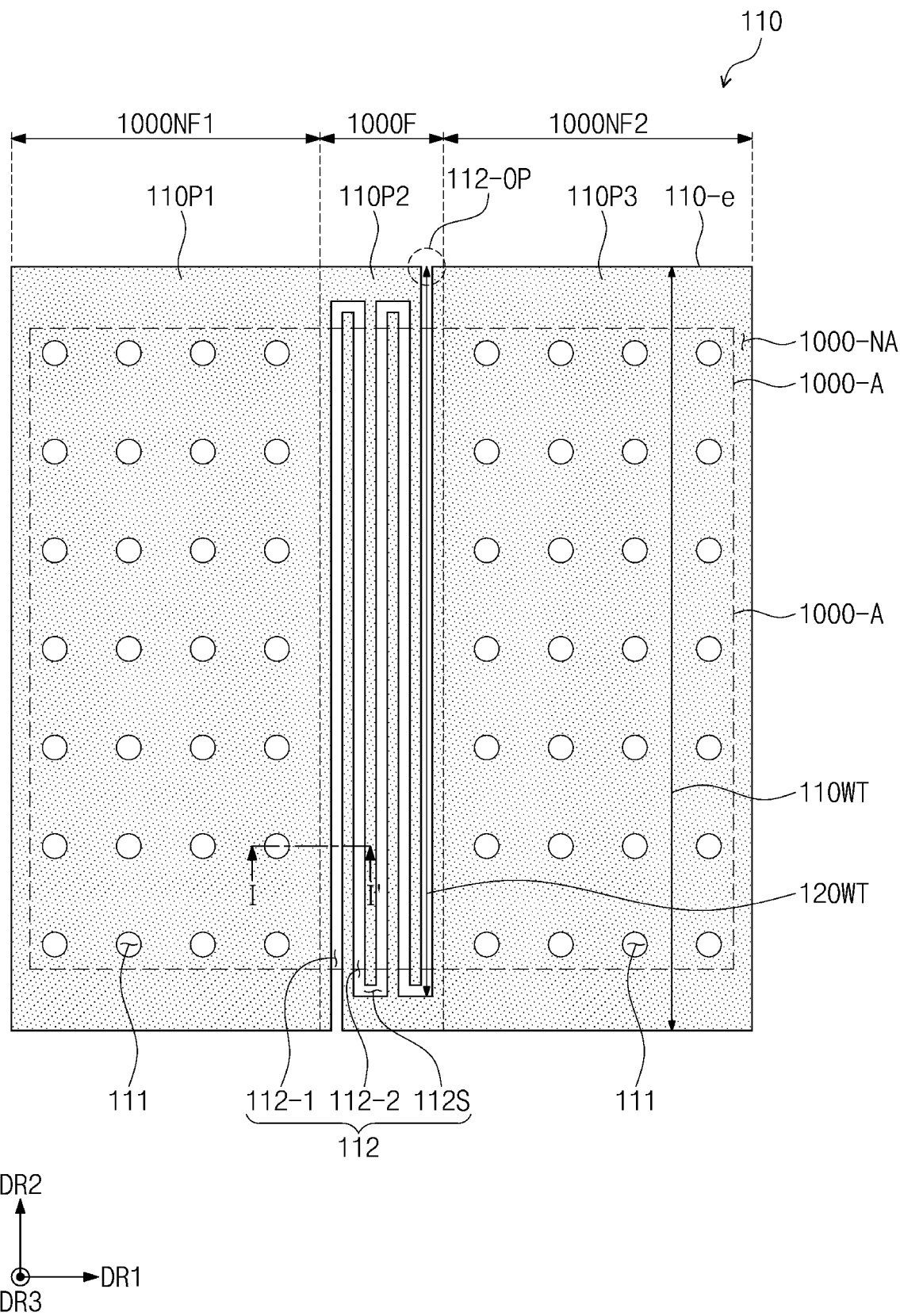
FIG. 7A is a plan view illustrating a light shielding layer according to an embodiment of the present disclosure.
Figure 7B:
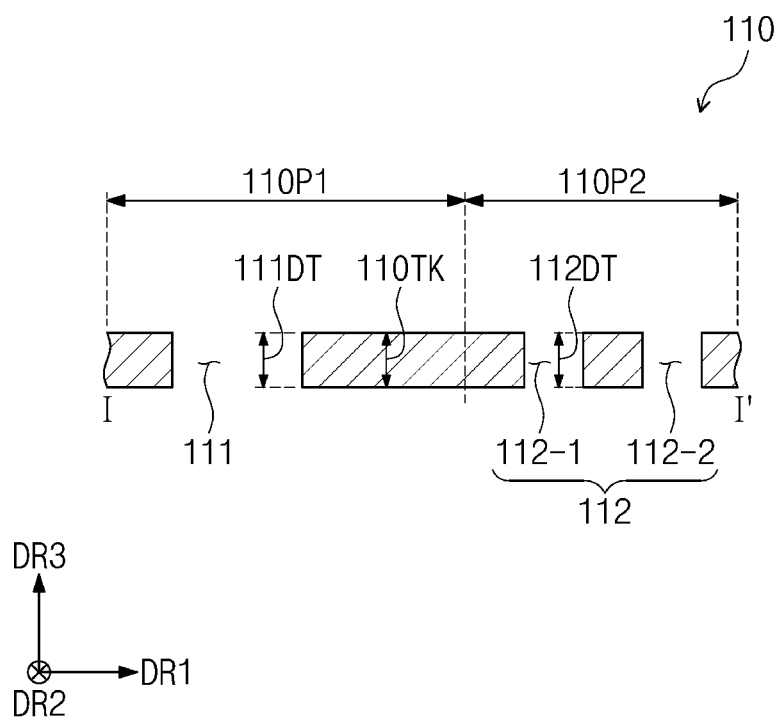
FIG. 7B is a cross-sectional view taken along line I-I' of FIG. 7A.

FIG. 7A is a plan view illustrating the light shielding layer 110 according to an embodiment of the present disclosure. FIG. 7B is a cross-sectional view taken along line I-I' in FIG. 7A.

Referring to FIGS. 7A and 7B, the light shielding layer 110 may include a first portion 110P1, a second portion 110P2, and a third portion 110P3. The first portion 110P1 may be a portion disposed on the first non-folding area 1000NF1, the second portion 110P2 may be a portion disposed on the folding area 1000F, and the third portion 110P3 may be a portion disposed on the second non-folding area 1000NF2.

The plurality of holes 111 may be defined in each of the first portion 110P1 and the third portion 110P3, and the cut portion 112 may be defined in the second portion 110P2. The cut portion 112 may have a winding shape on a plane. Each of the plurality of holes 111 may be defined by removing a portion of the light shielding layer 110. Each of the plurality of holes 111 may have a depth 111DT that is equal to a thickness 110TK of the light shielding layer 110. Each of the plurality of holes 111 may be provided by removing a thickness direction of the light shielding layer 110, e.g., all portions of the light shielding layer 110 in the third direction DR3.

When viewed on a plane, each of the plurality of holes 111 may have a circular shape. However, the embodiments of the present disclosure are not limited thereto. For example, each of the plurality of holes 111 may have various shapes such as an oval shape or a polygonal shape. Each of the plurality of holes 111 may be arranged in the first direction DR1 and the second direction DR2. For example, the plurality of holes 111 may be arranged in a matrix form.

The cut portion 112 may include a plurality of primary slits 112-1 and 112-2 and secondary slits 112S connected to the primary slits 112-1 and 112-2. Each of the plurality of primary slits 112-1 and 112-2 may extend in the second direction DR2. The plurality of primary slits 112-1 and 112-2 may be spaced apart from each other in the first direction DR1. The secondary slits 112S may be connected to two neighboring primary slits 112-1 and 112-2. Thus, the cut portion 112 may have a winding shape when viewed from a plane.

Each of the plurality of primary slits 112-1 and 112-2 may have a second directional length 120WT less than a second directional width 110WT of the light shielding layer 110. Thus, although the plurality of primary slits 112-1 and 112-2 are provided at the light shielding layer 110, one portion and another portion of the light shielding layer 110 may not be electrically separated from each other. A portion of the plurality of primary slits 112-1 and 112-2 may extend toward an edge 110-e of the light shielding layer 110. In some embodiments, one portion of the edge 110-e of the light shielding layer 110 may be spaced apart from another portion of the edge 110-e in a set or predetermined area 112-OP.

The cut portion 112 may have a depth 112DT that is equal to the thickness 110TK of the light shielding layer 110. The cut portion 112 may be provided by removing a thickness direction of the light shielding layer 110, e.g., all portions of the light shielding layer 110 in the third direction DR3.

The light shielding layer 110 may have one portion overlapping the display area 1000-A and the other portion overlapping the non-display area 1000-NA. For example, the secondary slits 112S may overlap the non-display area 1000-NA. That is, the secondary slits 112S may be disposed on the non-display area 1000-NA (as shown, for example, in FIG. 1A) of the display panel 100 (as shown, for example, in FIG. 3A).

Figure 8:
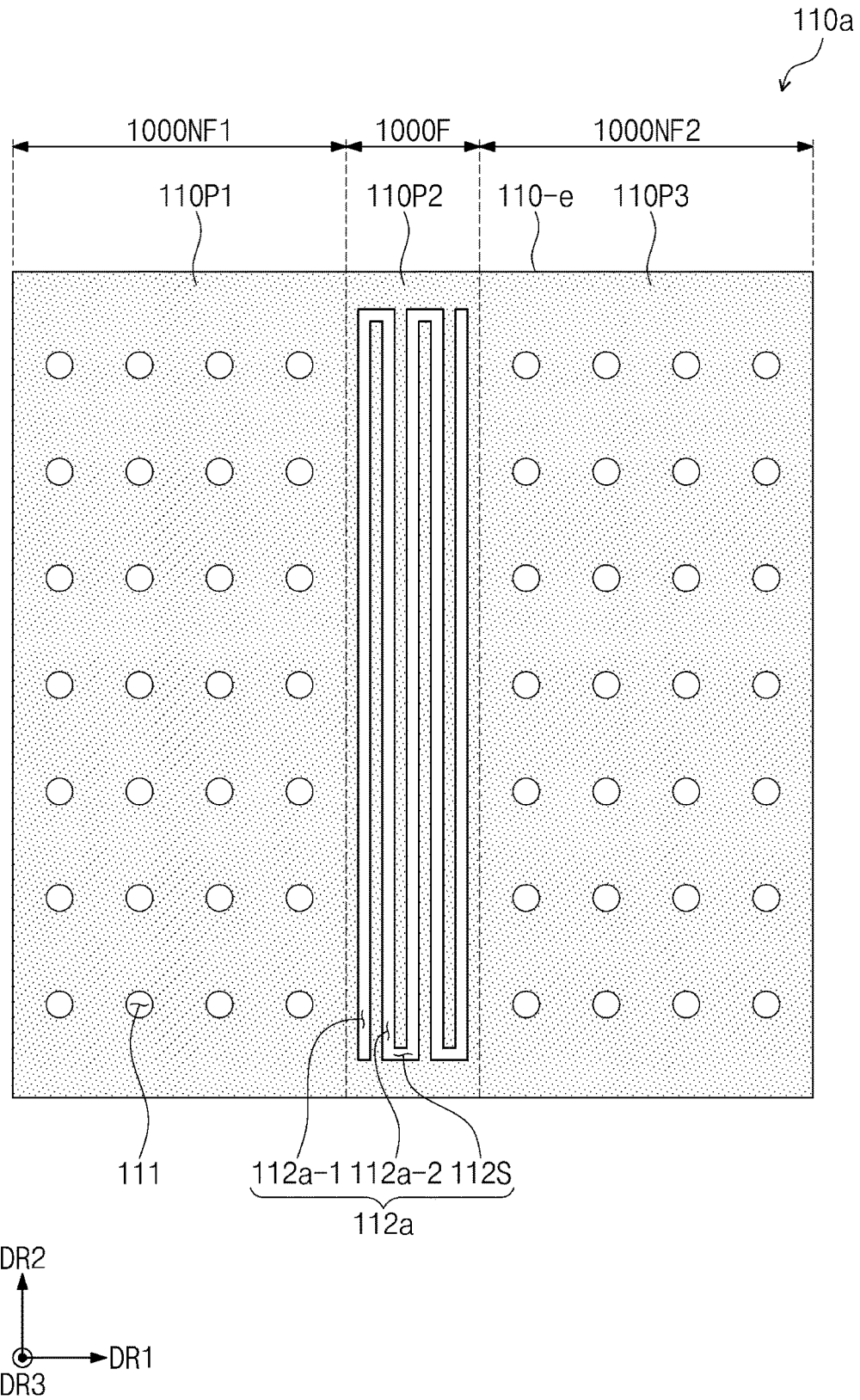
FIG. 8 is a plan view illustrating a light shielding layer according to an embodiment of the present disclosure.

FIG. 8 is a plan view illustrating a light shielding layer 110a according to an embodiment of the present disclosure.

Referring to FIG. 8, the light shielding layer 110a may include a first portion 110P1, a second portion 110P2, and a third portion 110P3. A plurality of holes 111 may be defined in each of the first portion 110P1 and the third portion 110P3, and a cut portion 112a may be defined in the second portion 110P2.

The cut portion 112a may include a plurality of primary slits 112a-1 and 112a-2 and secondary slits 112S connected to the primary slits 112a-1 and 112a-2. Each of the plurality of primary slits 112a-1 and 112a-2 may extend in the second direction DR2. The plurality of primary slits 112a-1 and 112a-2 may have the same length as each other in the second direction DR2. The plurality of primary slits 112a-1 and 112a-2 may be spaced apart from each other in the first direction DR1. The secondary slits 112S may be connected to two neighboring slits 112a-1 and 112a-2. Thus, the cut portion 112a may have a winding shape on a plane.

The cut portion 112a may be spaced apart from an edge 110-e of the light shielding layer 110a, and the cut portion 112a may be surrounded by the remaining portions of the light shielding layer 110a, which are not removed, on the plane.

Figure 9:
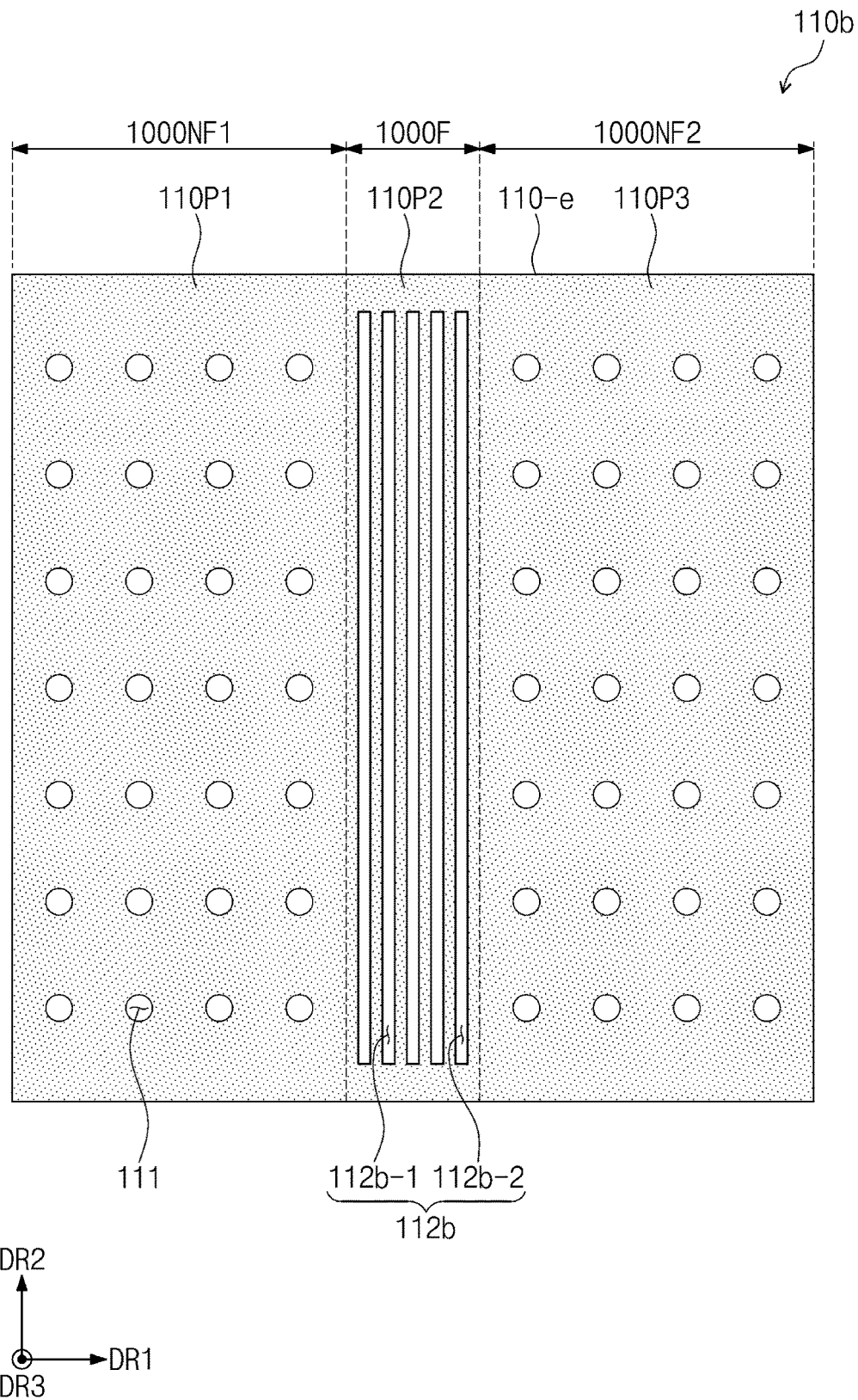
FIG. 9 is a plan view illustrating a light shielding layer according to an embodiment of the present disclosure.

FIG. 9 is a plan view illustrating a light shielding layer 110b according to an embodiment of the present disclosure.

Referring to FIG. 9, the light shielding layer 110b may include a first portion 110P1, a second portion 110P2, and a third portion 110P3. A plurality of holes 111 may be defined in each of the first portion 110P1 and the third portion 110P3, and a cut portion 112b may be defined in the second portion 110P2.

The cut portion 112b may include a plurality of slits 112b-1 and 112b-2. Each of the plurality of slits 112b-1 and 112b-2 may extend in the second direction DR2. The plurality of slits 112b-1 and 112b-2 may have the same length as each other in the second direction DR2. The plurality of slits 112b-1 and 112b-2 may be spaced apart from each other in the first direction DR1.

The cut portion 112b may be spaced apart from an edge 110-e of the light shielding layer 110b, and the cut portion 112b may be surrounded by the remaining portions of the light shielding layer 110b, which are not removed, on a plane.

Figure 10:
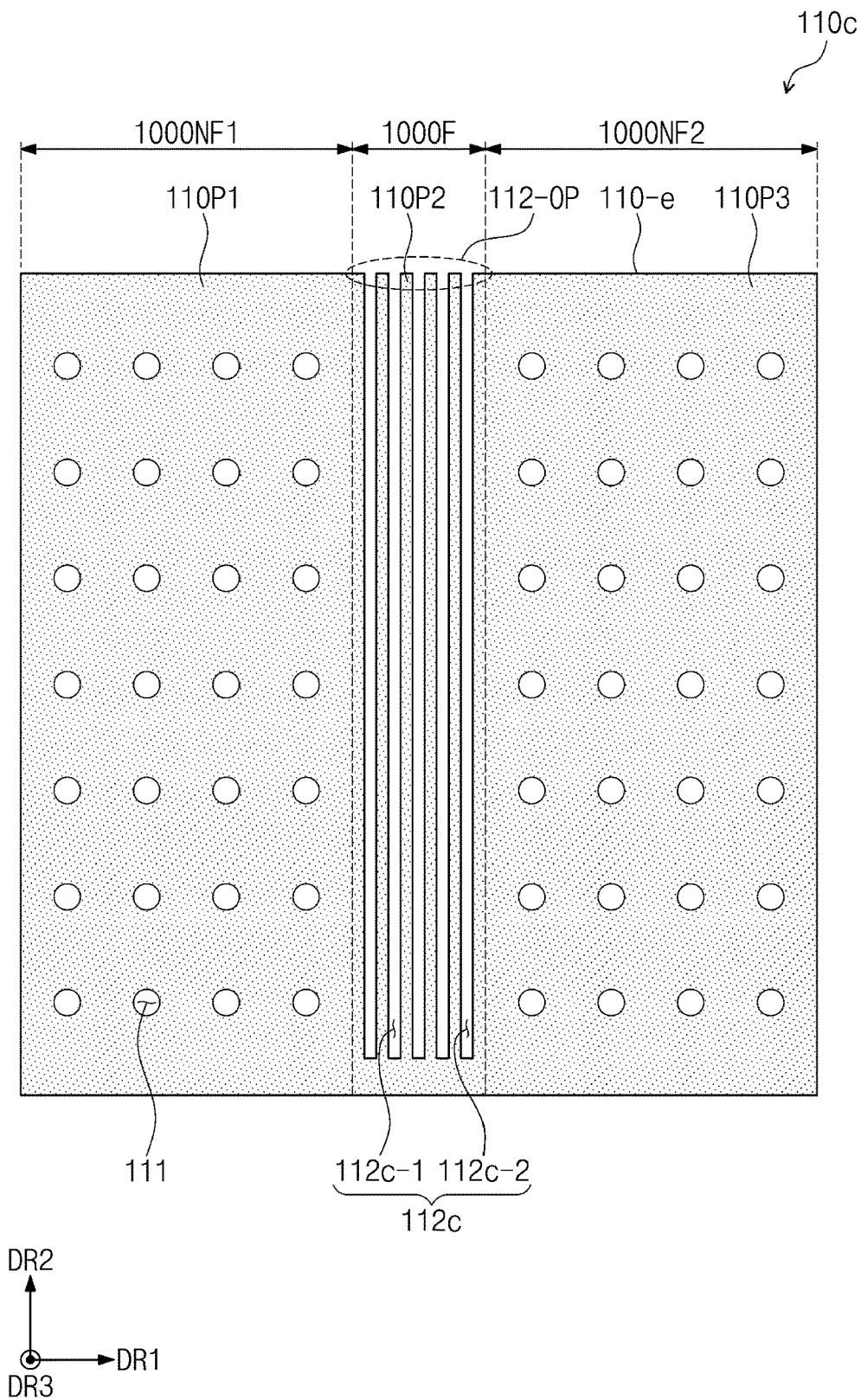
FIG. 10 is a plan view illustrating a light shielding layer according to an embodiment of the present disclosure.

FIG. 10 is a plan view illustrating a light shielding layer 110c according to an embodiment of the present disclosure.

Referring to FIG. 10, the light shielding layer 110c may include a first portion 110P1, a second portion 110P2, and a third portion 110P3. A plurality of holes 111 may be defined in each of the first portion 110P1 and the third portion 110P3, and a cut portion 112c may be defined in the second portion 110P2.

The cut portion 112c may include a plurality of slits 112c-1 and 112c-2. Each of the plurality of slits 112c-1 and 112c-2 may extend in the second direction DR2. The plurality of slits 112c-1 and 112c-2 may have the same length as each other in the second direction DR2. The plurality of slits 112c-1 and 112c-2 may be spaced apart from each other in the first direction DR1.

One end of each of the plurality of slits 112c-1 and 112c-2 may be adjacent to an edge 110-e of the light shielding layer 110c. Thus, portions of the edge 110-e of the light shielding layer 110c may be spaced apart from other portions in a set or predetermined area 112-OP.

Figure 11:
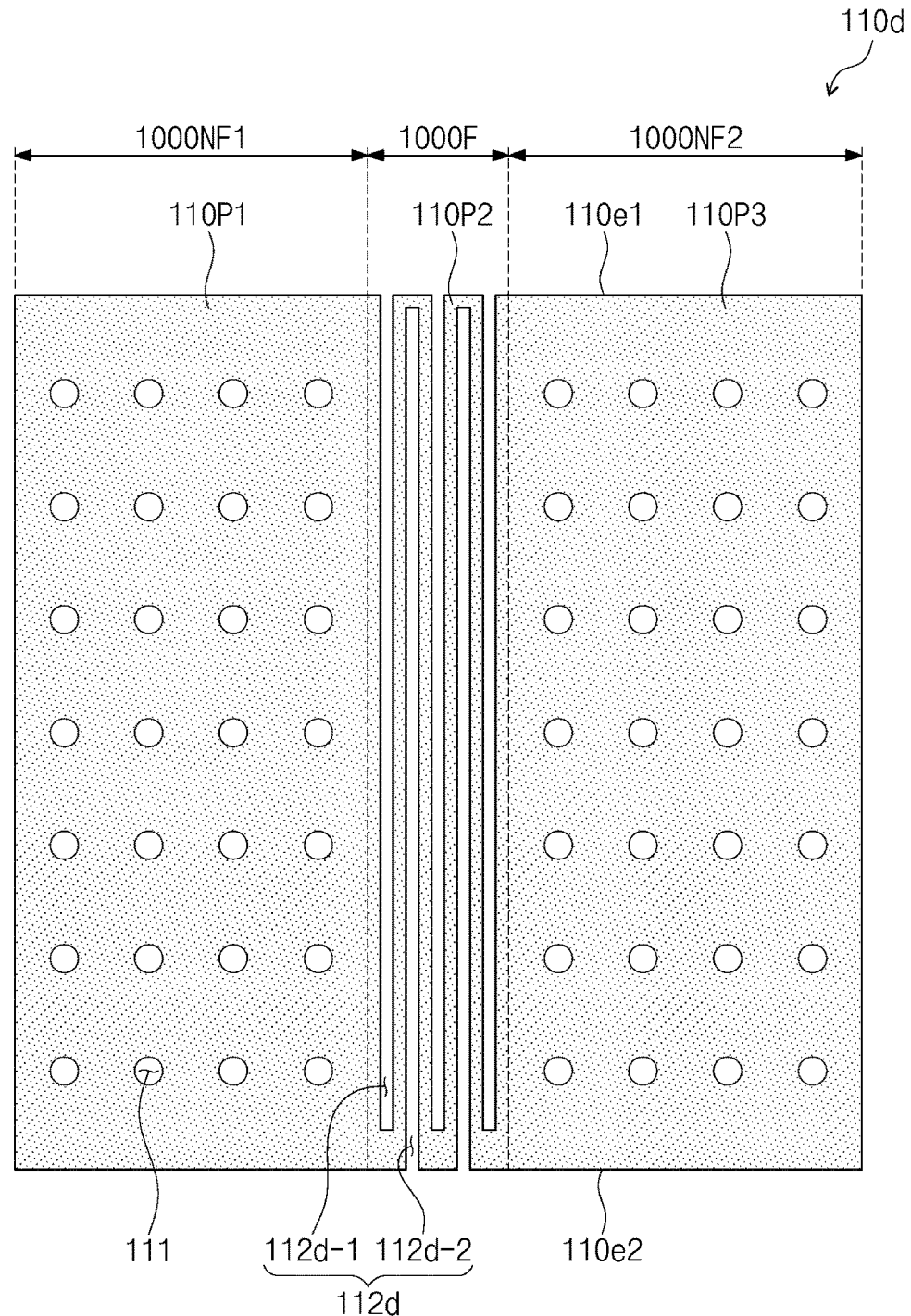
FIG. 11 is a plan view illustrating a light shielding layer according to an embodiment of the present disclosure.

FIG. 11 is a plan view illustrating a light shielding layer 110d according to an embodiment of the present disclosure.

Referring to FIG. 11, the light shielding layer 110d may include a first portion 110P1, a second portion 110P2, and a third portion 110P3. A plurality of holes 111 may be defined in each of the first portion 110P1 and the third portion 110P3, and a cut portion 112d may be defined in the second portion 110P2. When viewed on a plane, one portion of the light shielding layer 110d in which a cut portion 112d is defined may have a winding shape.

The cut portion 112d may include a plurality of slits 112d-1 and 112d-2. Each of the plurality of slits 112d-1 and 112d-2 may extend in the second direction DR2. The plurality of slits 112d-1 and 112d-2 may have the same or different lengths as each other in the second direction DR2. The plurality of slits 112d-1 and 112d-2 may be spaced apart from each other in the first direction DR1.

One portion of the plurality of slits 112d-1 and 112d-2 may be adjacent to a first edge 110e1 of the light shielding layer 110d, and the remaining portions of the plurality of slits 112d-1 and 112d-2 may be adjacent to a second edge 110e2 of the light shielding layer 110d. The first edge 110e1 and the second edge 110e2 may each extend in the first direction DR1 and may be spaced apart from each other in the second direction DR2.

Figure 12:
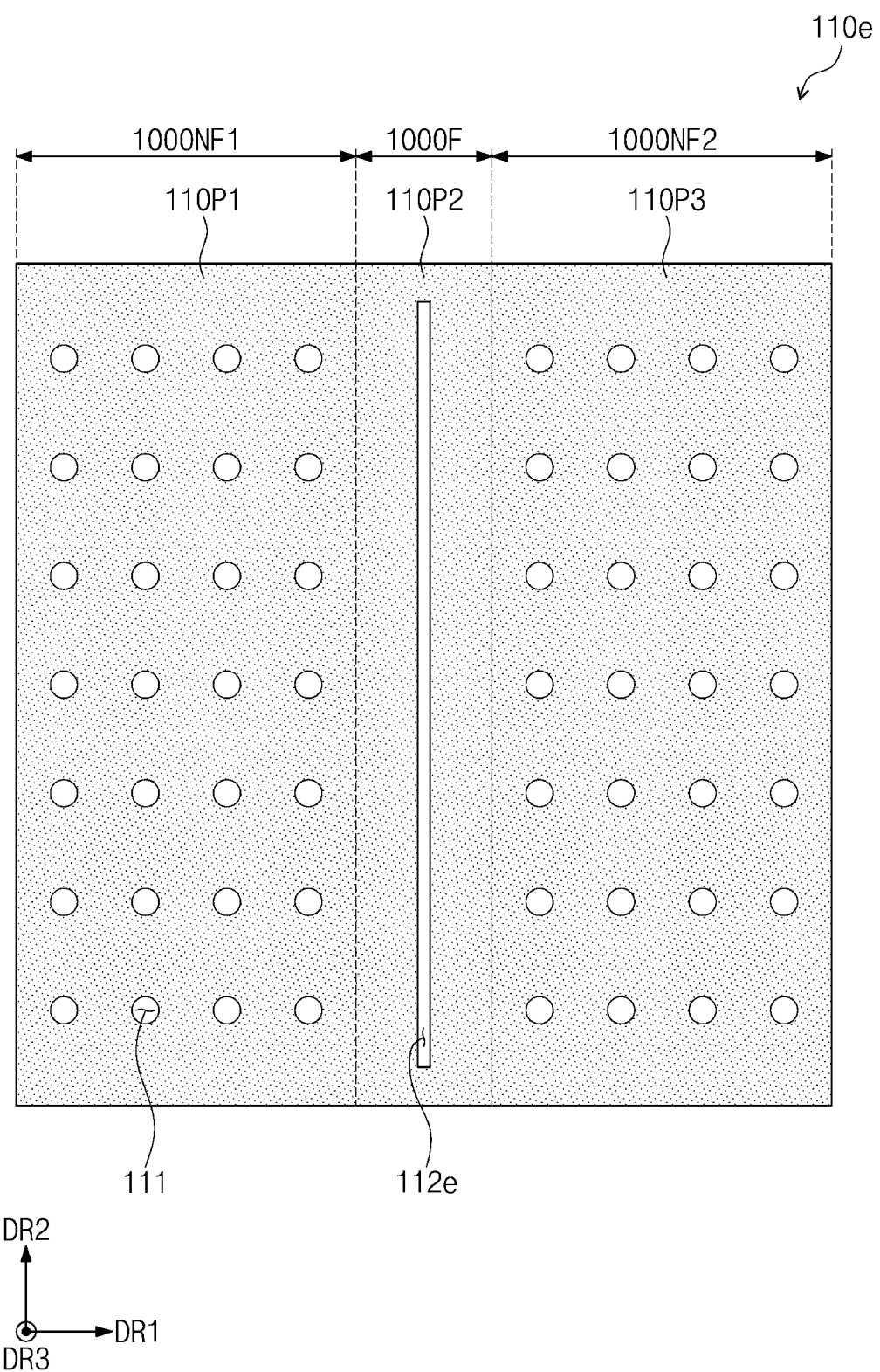
FIG. 12 is a plan view illustrating a light shielding layer according to an embodiment of the present disclosure.

FIG. 12 is a plan view illustrating a light shielding layer 110e according to an embodiment of the present disclosure.

Referring to FIG. 12, the light shielding layer 110e may include a first portion 110P1, a second portion 110P2, and a third portion 110P3. A plurality of holes 111 may be defined in each of the first portion 110P1 and the third portion 110P3, and a cut portion 112e may be defined in the second portion 110P2. The cut portion 112e may have a shape extending in a set or predetermined direction. For example, the cut portion 112e may have a shape extending in the second direction DR2.

The cut portion 112e may have a second directional length less than a second directional width of the light shielding layer 110e. Thus, although the cut portion 112e is provided at the light shielding layer 110e, one portion and another portion of the light shielding layer 110e may not be electrically separated from each other.

Figure 13A:
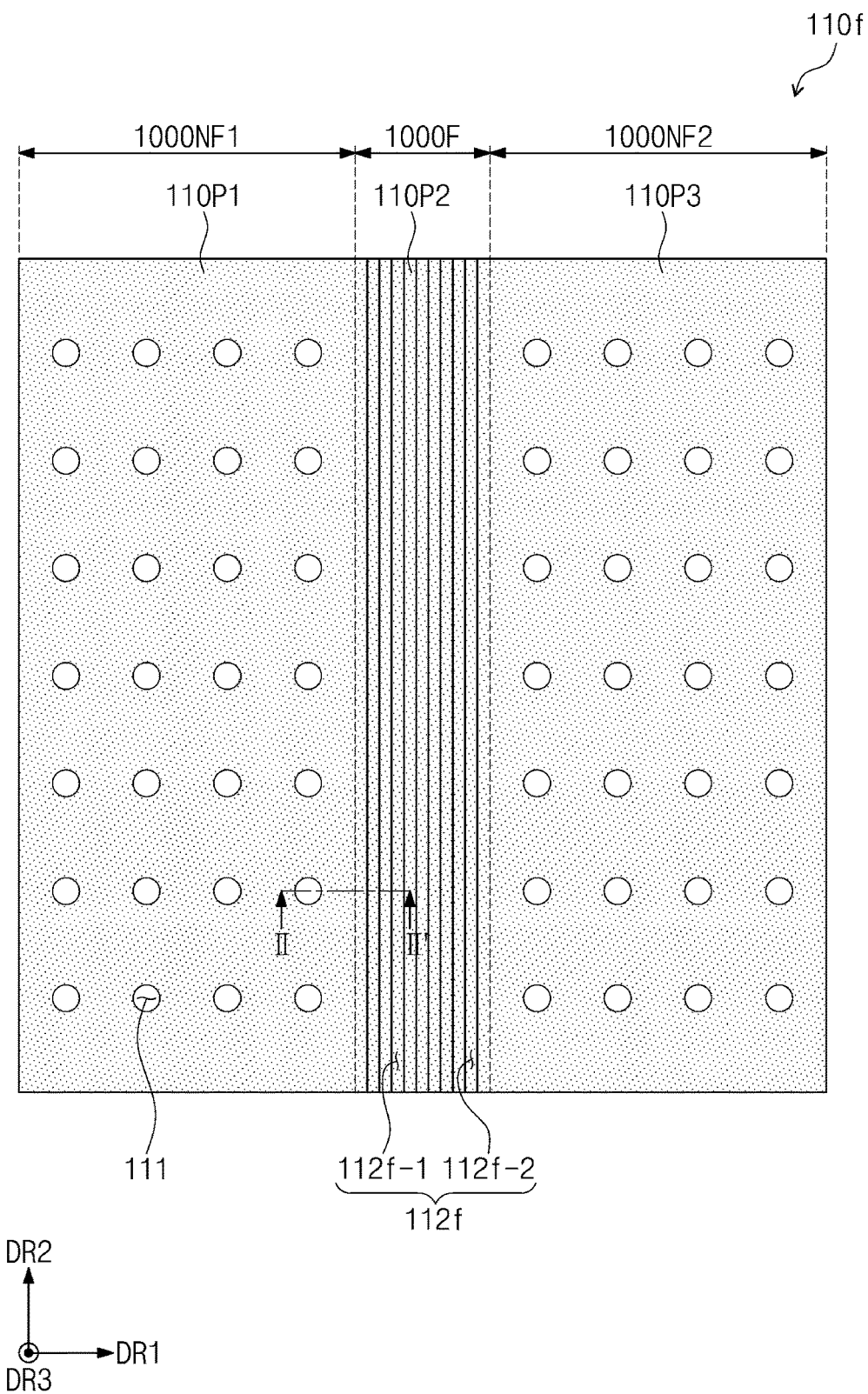
FIG. 13A is a plan view illustrating a light shielding layer according to an embodiment of the present disclosure.
Figure 13B:
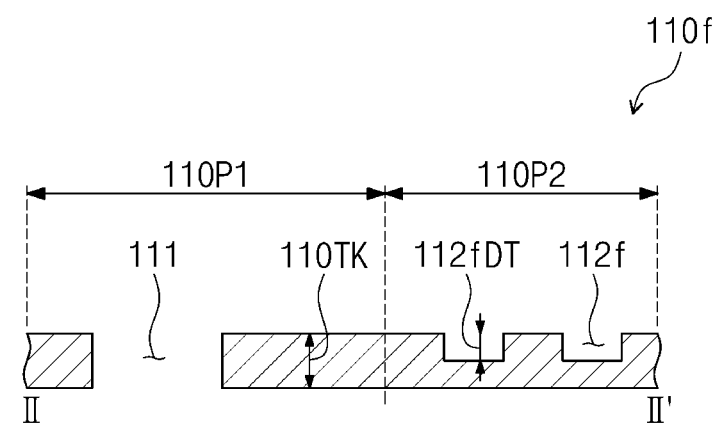
FIG. 13B is a cross-sectional view taken along line II-II' of FIG. 13A.
Figure 13B:
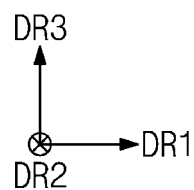

FIG. 13A is a plan view illustrating a light shielding layer 110f according to an embodiment of the present disclosure. FIG. 13B is a cross-sectional view taken along line II-II' of FIG. 13A.

Referring to FIGS. 13A and 13B, the light shielding layer 110f may include a first portion 110P1, a second portion 110P2, and a third portion 110P3. A plurality of holes 111 may be defined in each of the first portion 110P1 and the third portion 110P3, and a cut portion 112f may be defined in the second portion 110P2.

The cut portion 112f may have a depth 112fDT less than a thickness 110TK of the light shielding layer 110f. The cut portion 112f may be provided by removing a thickness direction of the light shielding layer 110f, e.g., a portion of the light shielding layer 110f in the third direction DR3. As at least one portion of the light shielding layer 110f overlapping the folding area 1000F has a relatively small thickness, the light shielding layer 110f may have an enhanced flexibility.

Hereinabove, although the shapes of the cut portions 112, 112a, 112b, 112c, 112d, 112e, and 112f defined in the light shielding layers 110, 110a, 110b, 110c, 110d, 110e, and 110f are described as examples above, the embodiments of the present disclosure are not limited to the shapes in the drawings.

According to embodiments of the present disclosure, the light shielding layer, in which the holes for adjusting the incidence angle of the light incident to the input sensor are defined, is provided in the display panel. Aligning components in the display panel with the holes may be easier than separately manufacturing the light shielding layer and then attaching the manufactured light shielding layer to the display panel. Also, because the cut portion is provided to one area of the light shielding layer overlapping the folding area, a stress generated at the light shielding layer in the folding area may be reduced. Thus, the display device may have the enhanced flexibility.

Although example embodiments of the present disclosure have been described, it is understood that the present disclosure should not be limited to these example embodiments but various changes and modifications can be made by one ordinary skilled in the art within the spirit and scope of the present disclosure as hereinafter claimed. Hence, the real protective scope of the present disclosure shall be determined by the technical scope of the accompanying claims and their equivalents.

What is claimed is:

1. A display device comprising:
 a display panel defining a folding area and a non-folding area and comprising a base layer, a circuit layer on the base layer, and a display element layer on the circuit layer;
 an input sensor below the display panel and defining a sensing area overlapping the non-folding area in a plan view; and
 a light shielding layer between the display element layer and the input sensor in a view perpendicular to the plan view,
 wherein the light shielding layer defines a plurality of holes in a first portion of the light shielding layer at the non-folding area, and a cut portion extending in a direction in a second portion of the light shielding layer at the folding area.

2. The display device of claim 1, wherein the circuit layer comprises a semiconductor pattern on the base layer, an insulation layer covering the semiconductor pattern, and a conductive layer on the insulation layer, and wherein the cut portion does not overlap the semiconductor pattern in the plan view.

3. The display device of claim 2, wherein the cut portion overlaps the conductive layer in the plan view.

4. The display device of claim 1, wherein the light shielding layer is configured to receive a voltage.

5. The display device of claim 1, wherein the light shielding layer is electrically connected to the circuit layer.

6. The display device of claim 1, wherein the folding area and the non-folding area are adjacent to each other in a first direction, and the cut portion extends in a second direction crossing the first direction.

7. The display device of claim 6, wherein the cut portion defines a plurality of primary slits, and the plurality of primary slits are spaced apart from each other in the first direction.

8. The display device of claim 7, wherein the light shielding layer has a width in the second direction, and wherein the width of the light shielding layer is greater than a length of each of the plurality of primary slits in the second direction.

9. The display device of claim 7, wherein the cut portion further comprises a secondary slit configured to connect at least two of the plurality of primary slits with each other.

10. The display device of claim 9, wherein the display panel defines a display area configured to display an image and a non-display area adjacent to the display area, and the secondary slit is in the non-display area.

11. The display device of claim 1, wherein the input sensor overlaps the folding area and the non-folding area in the plan view, and the input sensor defines a non-sensing area, and the non-sensing area overlaps the folding area in the plan view.

12. The display device of claim 1, wherein the input sensor does not overlap the folding area of the display panel in the plan view.

13. The display device of claim 1, wherein the input sensor comprises a plurality of sensing elements in the sensing area, and the plurality of sensing elements are configured to sense light passing through the plurality of holes.

14. The display device of claim 1, wherein the cut portion has a depth equal to a thickness of the light shielding layer.

15. The display device of claim 1, wherein the cut portion has a depth less than a thickness of the light shielding layer.

16. The display device of claim 1, wherein each of the plurality of holes has an area different from that of the cut portion in the plan view.

17. The display device of claim 1, wherein the light shielding layer is between the base layer and the circuit layer, and the light shielding layer is contained in the display panel.

18. A display device comprising:
 an input sensor;
 a base layer on the input sensor;
 a circuit layer on the base layer and comprising a semiconductor pattern;
 a display element layer on the circuit layer; and
 a light shielding layer between the input sensor and the display element layer in a view perpendicular to a plan view; and wherein the light shielding layer defines a plurality of holes and a cut portion spaced apart from the semiconductor pattern in the plan view.

19. The display device of claim 18, wherein the circuit layer further comprises a conductive layer on the semiconductor pattern, and the cut portion and the conductive layer overlap each other in the plan view.

20. The display device of claim 18, wherein the light shielding layer is between the base layer and the circuit layer.

21. A display device comprising:
a base layer in which a first non-folding area, a folding area, and a second non-folding area are sequentially defined in a first direction;
a circuit layer on the base layer and comprising a semiconductor pattern, an insulation layer, and a conductive layer;
a display element layer on the circuit layer; and
a light shielding layer defining a cut portion extending in a second direction crossing the first direction in an area overlapping the folding area in a plan view, and defining a plurality of holes in an area overlapping the first non-folding area and the second non-folding area in the plan view; and
an input sensor below the base layer,
wherein the input sensor is in an area overlapping at least one of the first non-folding area or the second non-folding area in the plan view.

22. The display device of claim 21, wherein the cut portion does not overlap the semiconductor pattern in the plan view, and the cut portion overlaps the conductive layer in the plan view.

23. The display device of claim 21, wherein the light shielding layer is between the base layer and the circuit layer.

* * * * *